(12) United States Patent
Han et al.

(10) Patent No.: US 11,138,940 B2
(45) Date of Patent: Oct. 5, 2021

(54) SCAN DRIVER AND DISPLAY DEVICE INCLUDING THE SAME

(71) Applicant: SAMSUNG DISPLAY CO., LTD., Yongin-si (KR)

(72) Inventors: Sang Su Han, Yongin-si (KR); Kyun Ho Kim, Yongin-si (KR); Jung Taek Kim, Yongin-si (KR); Joon Suk Baik, Yongin-si (KR); Se Keun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/007,268

(22) Filed: Aug. 31, 2020

(65) Prior Publication Data

US 2021/0210019 A1 Jul. 8, 2021

(30) Foreign Application Priority Data

Jan. 7, 2020 (KR) .......................... 10-2020-0002219

(51) Int. Cl.
*G09G 3/3266* (2016.01)
*G09G 3/3291* (2016.01)
*H01L 27/32* (2006.01)

(52) U.S. Cl.
CPC ......... *G09G 3/3266* (2013.01); *G09G 3/3291* (2013.01); *H01L 27/322* (2013.01); *H01L 27/3276* (2013.01)

(58) Field of Classification Search
CPC combination set(s) only.
See application file for complete search history.

(56) References Cited

U.S. PATENT DOCUMENTS

| 9,754,536 | B2* | 9/2017 | Chang | G09G 3/3233 |
| 10,198,999 | B2* | 2/2019 | Pyeon | G09G 3/3291 |
| 10,460,666 | B2 | 10/2019 | Kim | |
| 10,546,531 | B2 | 1/2020 | Li | |
| 10,902,782 | B2* | 1/2021 | Park | G09G 3/3233 |
| 10,971,083 | B2* | 4/2021 | Meng | G09G 3/3291 |
| 2011/0122119 | A1* | 5/2011 | Bae | G09G 3/3233 345/211 |

(Continued)

FOREIGN PATENT DOCUMENTS

| CN | 106935192 B | 4/2019 |
| KR | 1020180077699 A | 7/2018 |
| KR | 1020190018803 A | 2/2019 |

*Primary Examiner* — Sardis F Azongha
(74) *Attorney, Agent, or Firm* — Cantor Colburn LLP

(57) ABSTRACT

A display device includes a scan driver which includes a first stage including a first output terminal connected to a first carry line, a second output terminal connected to a first scan line, and a third output terminal connected to a first sensing line, and a second stage including a first input terminal connected to the first carry line, a fourth output terminal connected to a second scan line, and a fifth output terminal connected to a second sensing line. In a sensing period, signals having a turn-on level are respectively output from the first output terminal, the second output terminal, and the third output terminal during a predetermined delay period before signals having a turn-on level are respectively output from the fourth output terminal and the fifth output terminal.

20 Claims, 10 Drawing Sheets

(56) References Cited

U.S. PATENT DOCUMENTS

| | | | |
|---|---|---|---|
| 2016/0012800 A1* | 1/2016 | Han | G09G 3/3233 |
| | | | 345/213 |
| 2016/0098961 A1* | 4/2016 | Han | G09G 3/3291 |
| | | | 345/691 |
| 2016/0189621 A1* | 6/2016 | Kim | G09G 3/3258 |
| | | | 345/215 |
| 2016/0217728 A1* | 7/2016 | In | G09G 3/3266 |
| 2017/0162122 A1* | 6/2017 | In | G09G 3/3266 |
| 2019/0066603 A1* | 2/2019 | Lee | G09G 3/3233 |
| 2020/0160781 A1* | 5/2020 | Park | G09G 3/3275 |

* cited by examiner

FIG. 9
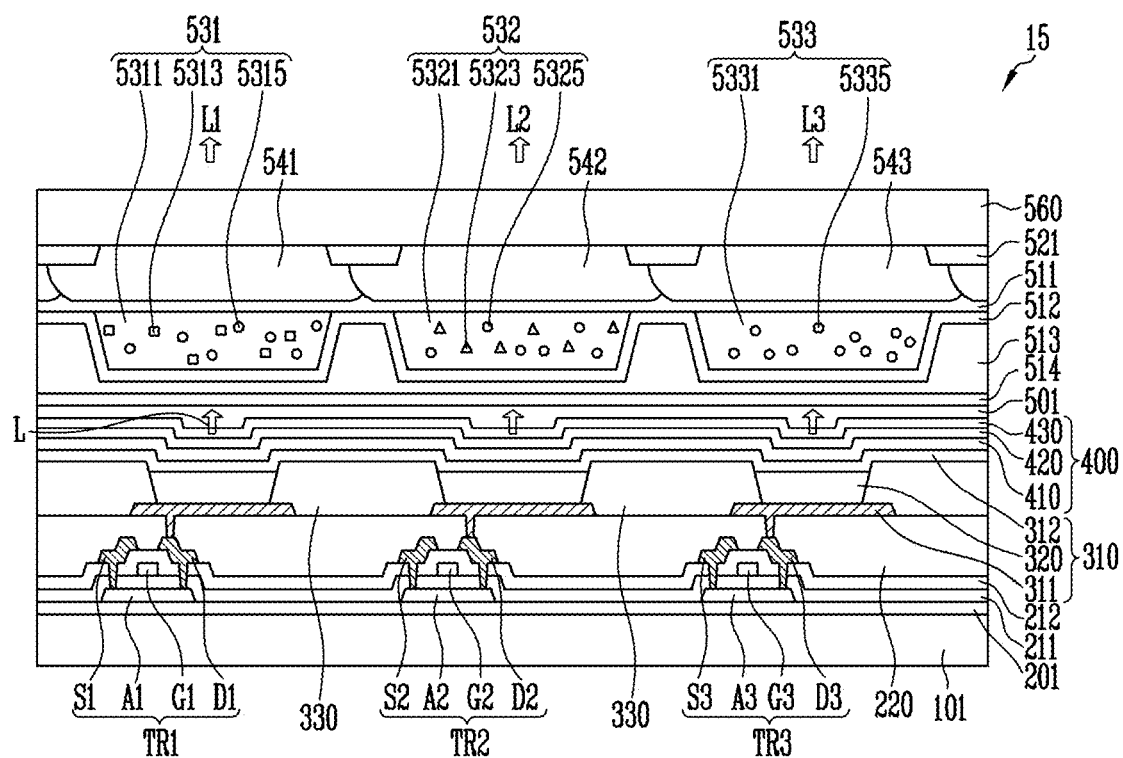

SCAN DRIVER AND DISPLAY DEVICE INCLUDING THE SAME

The application claims priority to Korean patent application 10-2020-0002219, filed on Jan. 7, 2020, and all the benefits accruing therefrom under 35 U.S.C. § 119, the content of which in its entirety is herein incorporated by reference.

BACKGROUND

1. Field

Exemplary embodiments of the invention generally relate to a scan driver and a display device including the same.

2. Description of Related Art

With a development of information technologies, an importance of a display device which is a connection medium between a user and information increases. Accordingly, a display device such as a liquid crystal display device, an organic light emitting display device, and a plasma display device is increasingly used.

Each of pixels of the display device emits light with a luminance corresponding to a data voltage supplied through a data line. The display device displays an image frame by a combination of lights emitted from the pixels.

The pixels may be connected to each data line. Therefore, a scan driver which provides a scan signal for selecting a pixel to which a data voltage is to be supplied among the pixels is desired. The scan driver is configured in a form of a shift register, to sequentially provide a scan signal having a turn-on level in a scan line unit.

In addition, when necessary, a scan driver which selectively provides a scan signal having a turn-on level to only a desired scan line so as to sense mobility information or threshold voltage information of a driving transistor of a pixel is desired.

SUMMARY

Exemplary embodiments of the invention provide a scan driver in which electric discharge does not occur during a sensing period, and a display device including the scan driver.

An exemplary embodiment of the invention provides a display device driven for at least one frame including a display period and a sensing period, the display device including a pixel unit including a plurality of pixels, and a scan driver including a plurality of stages each connected to each of the plurality of pixels, a scan line, and a sensing line, where the scan driver includes a first stage including a first output terminal connected to a first carry line, a second output terminal connected to a first scan line, and a third output terminal connected to a first sensing line, and a second stage including a first input terminal connected to the first carry line, a fourth output terminal connected to a second scan line, and a fifth output terminal connected to a second sensing line, where, in the sensing period, signals having the turn-on level are respectively output from the first output terminal, the second output terminal, and the third output terminal during a predetermined delay period before signals having the turn-on level are respectively output from the fourth output terminal and the fifth output terminal.

In an exemplary embodiment, the display period may be a period for reproducing an input image on a screen by supplying a data voltage to each of the plurality of pixels, and the sensing period may be a period for performing a process of inputting a black data voltage to each of the plurality of pixels, initializing the plurality of pixels, sensing the plurality of pixels, and then again inputting a black data voltage to the plurality of pixels.

In an exemplary embodiment, the predetermined delay period may be a period until a sensing period of stages disposed adjacent to each other is started after the process of again inputting the black data voltage, and be six horizontal periods or more. One horizontal period may be defined by one frame of the at least one frame.

In an exemplary embodiment, in the sensing period, a time at which the signals having the turn-on level are respectively output from the first output terminal, the second output terminal, and the third output terminal may be before 20 microseconds (μs) from a time at which the signals having the turn-on level are respectively output from the fourth output terminal and the fifth output terminal.

In an exemplary embodiment, the second output terminal may output the signal having the turn-on level in response to a signal provided from a first scan clock line connected to an input terminal of the first stage, the third output terminal may output the signal having the turn-on level in response to a signal provided from a first sensing clock line connected to an input terminal of the first stage, the fourth output terminal may output the signal having the turn-on level in response to the signal provided from a second scan clock line connected to an input terminal of the second stage, and the fifth output terminal may output the signal having the turn-on level in response to a signal provided from a second sensing clock line connected to an input terminal of the second stage.

In an exemplary embodiment, in the sensing period, the second output terminal may output the signal having the turn-on level at least three times, before the signals having the turn-on level are respectively output from the fourth output terminal and the fifth output terminal.

In an exemplary embodiment, in the sensing period, the turn-on level of the signal from the third output terminal may be maintained during a period from a time at which the second output terminal starts firstly providing the turn-on level to a time at which the second output terminal finishes secondly providing the turn-on level.

In an exemplary embodiment, in the sensing period, the turn-on level of the signal from the second output terminal may be maintained for six horizontal periods or more or 20 μs or more, before the signals having the turn-on signal are respectively output from the fourth output terminal and the fifth output terminal.

In an exemplary embodiment, in the sensing period, the first output terminal and the second output terminal may output a signal having the turn-on level for a same duration.

In an exemplary embodiment, the display device may further include a sensor connected to each of the plurality of pixels through a receiving line, the sensor measuring degradation information of the plurality of pixels according to a received current or voltage.

In an exemplary embodiment, the degradation information may include mobility information driving transistors, threshold voltage information of the driving transistors, and degradation information of light emitting devices.

In an exemplary embodiment, each of the plurality of pixels may include a first transistor including a first gate electrode connected to a first node, a first electrode connected to a first power line, and a second electrode connected to a second node, a second transistor including a second gate electrode connected to the scan line, a third electrode connected to a data line, and a fourth electrode connected to the first node, a third transistor including a third gate electrode connected to the sensing line, a fifth electrode connected to the receiving line, and a sixth electrode connected to the second node, and a light emitting device including an anode connected to the second node and a cathode connected to a second power line.

In an exemplary embodiment, the pixel unit may include a display substrate, a plurality of transistors disposed on the display substrate, a plurality of organic light emitting diodes disposed on the plurality of transistors, a wavelength conversion pattern disposed on the plurality of organic light emitting diodes, and a color filter disposed on the wavelength conversion pattern.

In an exemplary embodiment, the wavelength conversion pattern may include a quantum dot.

In an exemplary embodiment, the scan driver may be disposed as an oxide semiconductor thin film transistor gate ("OSG") driver circuit at one side of the pixel unit.

In an exemplary embodiment, in the sensing period, a time at which a turn-off level of the signals respectively at the fourth output terminal and the fifth output terminal is changed to the turn-on level is identical to a time at which the turn-on level of the signals respectively at the first output terminal, the second output terminal, and the third output terminal is changed to a turn-off level.

In an exemplary embodiment, the first stage may be disposed on an Nth row, and the second stage may be disposed on an (N+2)th row.

In an exemplary embodiment, each of the first stage and the second stage may include input terminals connected to a first power line, a second power line, and a third power line.

In an exemplary embodiment, each of the first stage and the second stage may include a P-type transistor.

An exemplary embodiment of the invention provides a scan driver driven for at least one frame including a display period and a sensing period, the scan driver including a first stage including a first output terminal connected to a first carry line, a second output terminal connected to a first scan line, and a third output terminal connected to a first sensing line, and a second stage including a first input terminal connected to the first carry line, a fourth output terminal connected to a second scan line, and a fifth output terminal connected to a second sensing line, where, in the sensing period, signals having a turn-on level are respectively output from the first output terminal, the second output terminal, and the third output terminal, before a predetermined period from a time at which signals having a turn-on level are respectively output from the fourth output terminal and the fifth output terminal, where the predetermined period is equal to or less than 20 μs.

BRIEF DESCRIPTION OF THE DRAWINGS

Exemplary embodiments will now be described more fully hereinafter with reference to the accompanying drawings, however, they may be embodied in different forms and should not be construed as limited to the exemplary embodiments set forth herein. Rather, these embodiments are provided so that this invention will be thorough and complete, and will fully convey the scope of the exemplary embodiments to those skilled in the art.

FIG. 9 is a schematic cross-sectional view illustrating an exemplary embodiment of a pixel unit in accordance with the invention.

DETAILED DESCRIPTION

Figure 1:
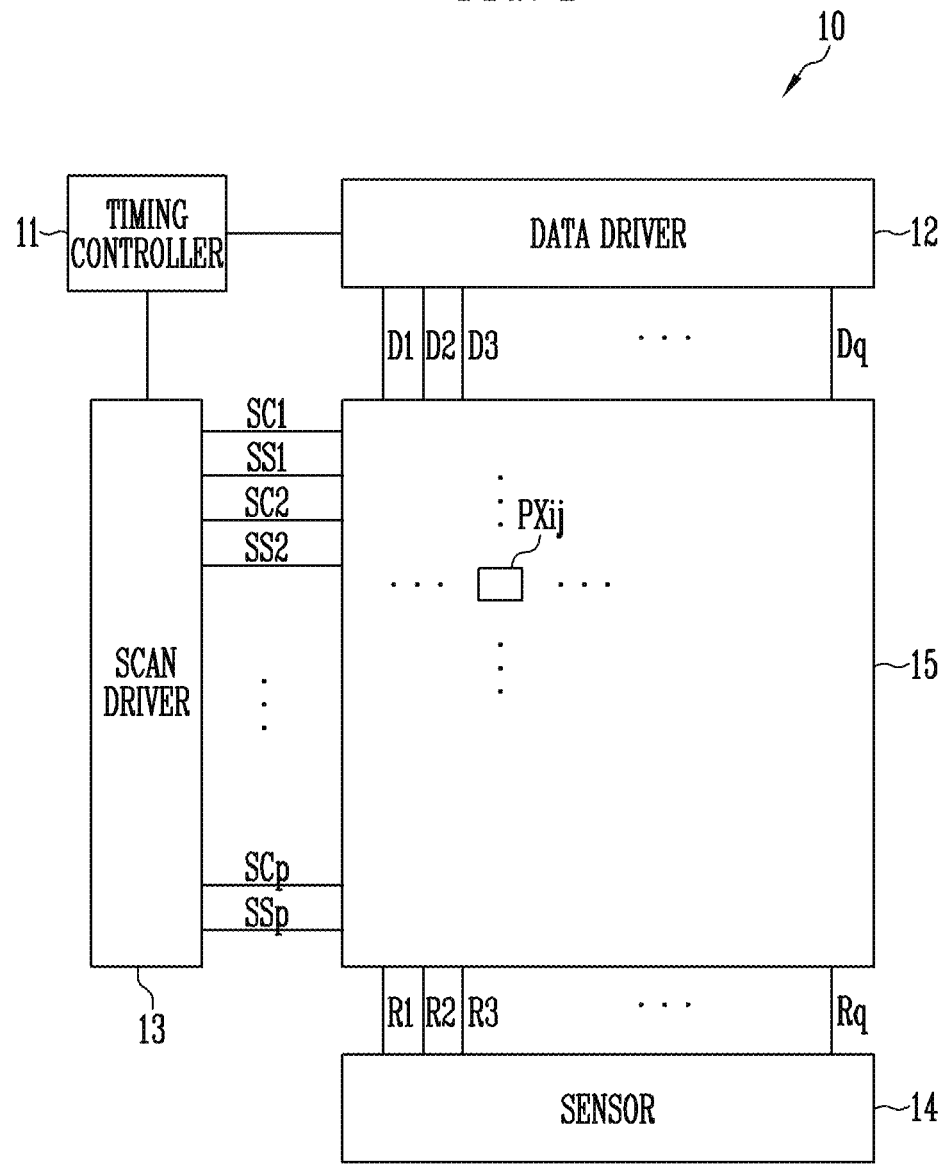
FIG. 1 is a schematic block diagram illustrating an exemplary embodiment of a display device in accordance with the invention.

The effects and characteristics of the invention and a method of achieving the effects and characteristics will be clear by referring to the exemplary embodiments described below in detail together with the accompanying drawings. However, the invention is not limited to the exemplary embodiments disclosed herein but may be implemented in various forms. The exemplary embodiments are provided by way of example only so that a person of ordinary skilled in the art can fully understand the features in the invention and the scope thereof.

The term "on" that is used to designate that an element or layer is on another element or layer includes both a case where an element or layer is located directly on another element or layer, and a case where an element or layer is located on another element or layer via still another element layer. In the entire description of the invention, the same drawing reference numerals are used for the same elements across various drawing figures.

Although the terms "first," "second," and the like are used for describing various components, these components are not confined by these terms. These terms are merely used for distinguishing one component from the other components. Therefore, a first component may be a second component or vice versa according to the technical concepts of the invention.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments will be described with reference to the accompanying drawings. Throughout the drawings, the same reference numerals are given to the same elements.

FIG. 1 is a schematic block diagram illustrating an exemplary embodiment of a display device in accordance with the invention.

Referring to FIG. 1, the display device 10 in the exemplary embodiment of the invention may include a timing controller 11, a data driver 12, a scan driver 13, a sensor 14, and a pixel unit 15.

The timing controller 11 may provide the data driver 12 with grayscale values for each frame, a control signal, and the like. Also, the timing controller 11 may provide a clock signal, a control signal, and the like to each of the scan driver 13 and the sensor 14.

The data driver 12 may generate data voltages to be provided to data lines D1, D2, D3, . . . , and Dq by the grayscale values, the control signal, and the like, which are received from the timing controller 11. In an exemplary embodiment, the data driver 12 may sample grayscale values by a clock signal, and apply data voltages corresponding to the grayscale values to data lines D1 to Dq in a unit of a pixel row (e.g., pixels connected to the same scan line), for example. Here, q may be a natural number.

The scan driver 13 may generate scan signals to be provided to scan lines SC1, SC2, . . . , and SCp by receiving the clock signal, the control signal, and the like from the timing controller 11. In an exemplary embodiment, the scan driver 13 may sequentially provide scan signals having a pulse of a turn-on level to the scan lines SC1 to SCp, for example. In an exemplary embodiment, the scan driver 13 may generate scan signals in a manner that sequentially transfers a pulse of a turn-on level to a next scan stage in response to the clock signal, for example. Here, p may be a natural number. In an exemplary embodiment, the scan driver 13 may be configured in the form of shift register, for example.

Also, the scan driver 13 may generate sensing signals to be provided to sensing lines SS1, SS2, . . . , and SSp. In an exemplary embodiment, the scan driver 13 may sequentially provide sensing signals having a pulse of a turn-on level to the sensing lines SS1 to SSp, for example. In an exemplary embodiment, the scan driver 13 may generate sensing signals in a manner than sequentially transfer a pulse of a turn-on level to a next stage in response to the clock signal, for example.

Figure 5:
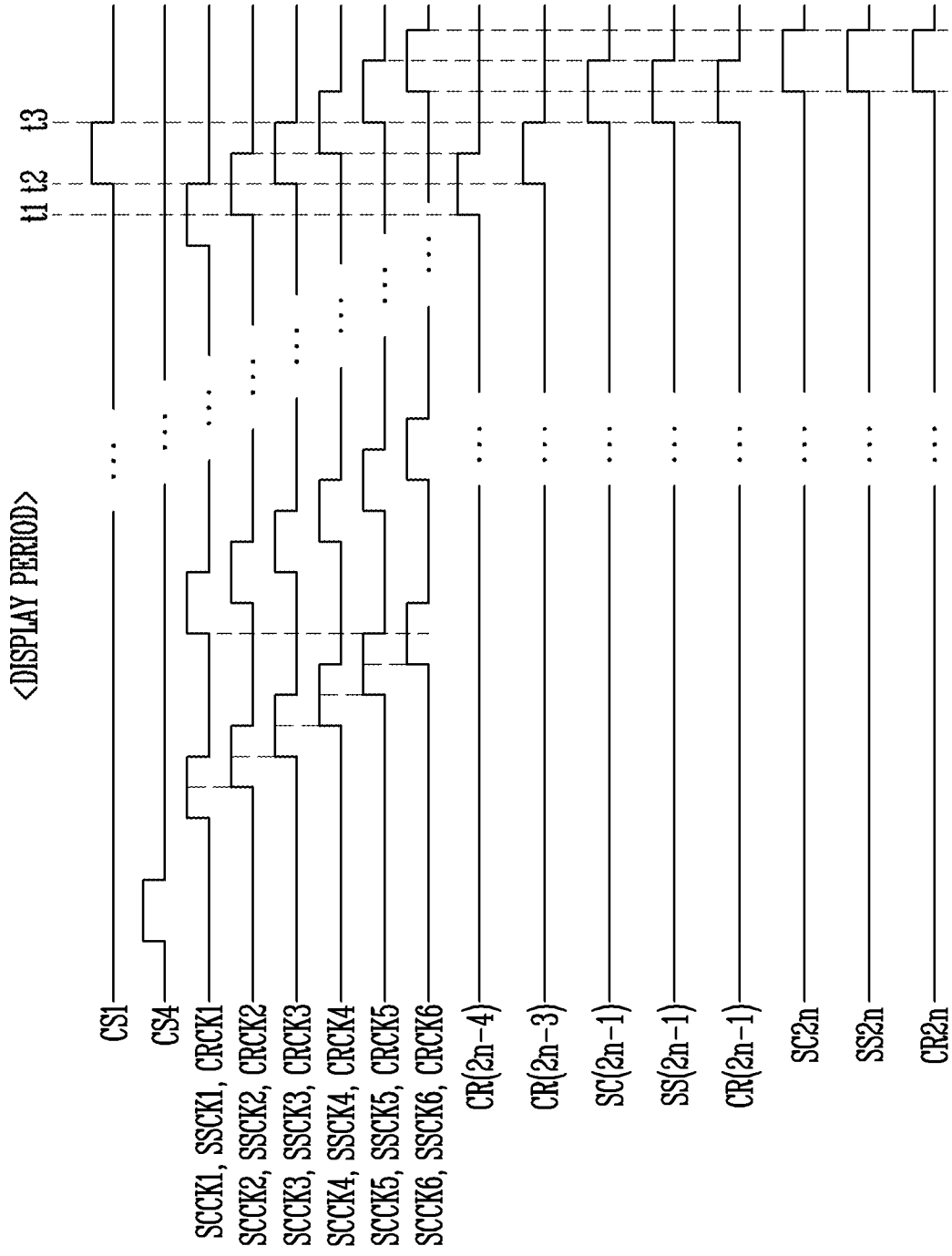
FIGS. 5 and 6 are timing diagrams illustrating an exemplary driving method of the scan driver in a display period.
Figure 8:
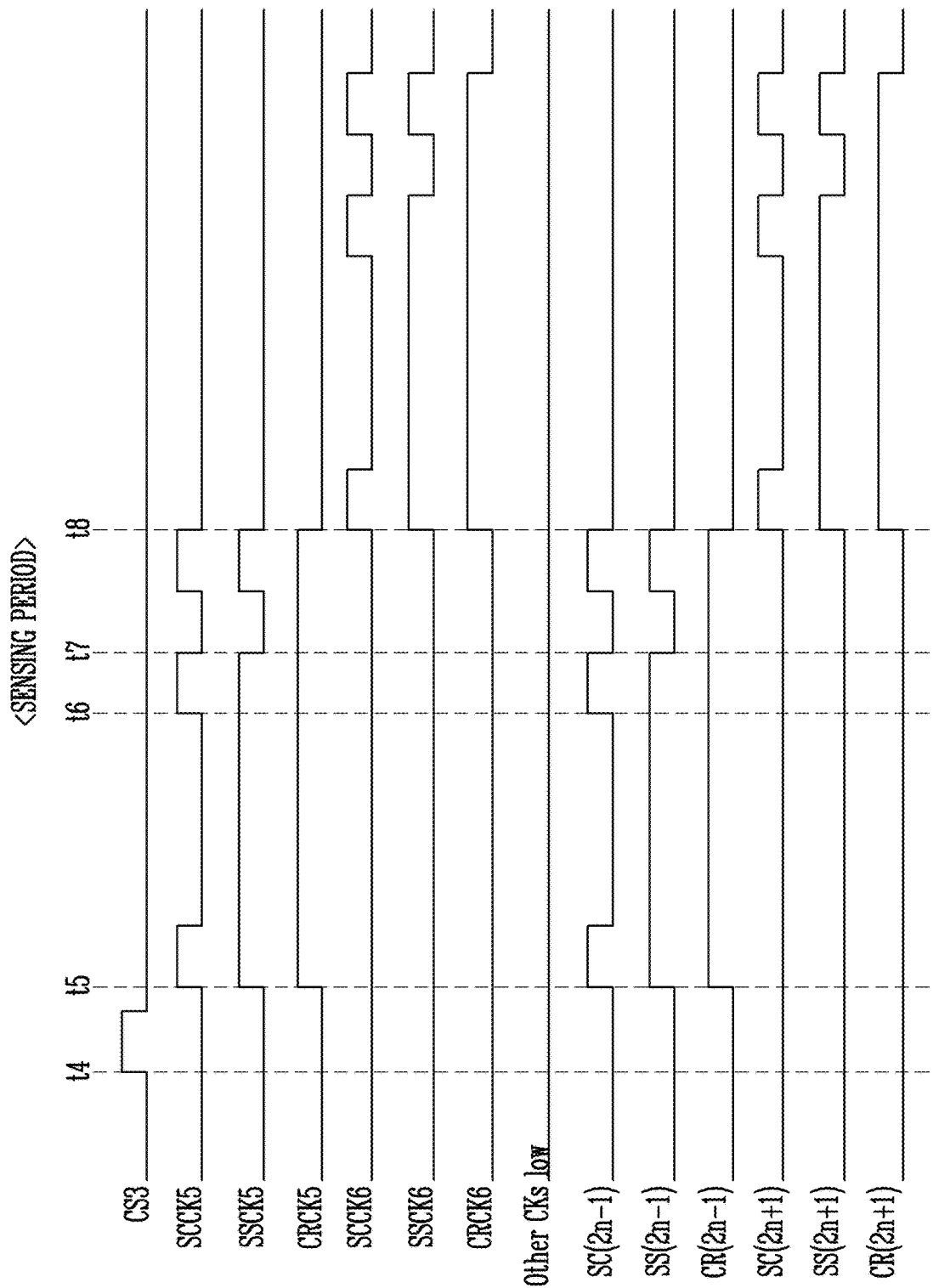
FIG. 8 is a timing diagram illustrating an exemplary driving method of the scan driver in a sensing period.

However, an operation of the scan driver 13 is related to an operation in a display period shown in FIG. 5, and an operation in a sensing period shown in FIG. 8 will be separately described.

In an exemplary embodiment, the display device 10 may be driven during frames each including a display period and a sensing period, for example. The display period corresponds to a period for reproducing an input image on screen by supplying a data voltage to each pixel PXij. The sensing period corresponds to a period for performing a process of inputting a black data voltage to each pixel PXij, initializing the pixel PXij, sensing the pixel PXij, and then again inputting a black data voltage to the pixel PXij. The sensing period may be a period for performing external compensation.

In an exemplary embodiment, the scan driver 13 may be simultaneously provided with pixels PXij through a thin film process. The scan driver 13 may be disposed (e.g., mounted) as an oxide semiconductor thin film transistor gate ("OSG") driver circuit at one side of the pixel unit 15. The scan driver 13 may include a driving chip (not shown) and a flexible circuit board (not shown) on which the driving chip is disposed (e.g., mounted). In another exemplary embodiment, the scan driver 13 may be disposed in a chip on glass ("COG") manner in a non-display region of the display device 10.

The sensor 14 may measure degradation information of pixels according to currents or voltages received through receiving lines R1, R2, R3, . . . , and Rq. In an exemplary embodiment, the degradation information of pixels may be mobility information of driving transistors, threshold voltage information of the driving transistors, degradation information of light emitting devices, etc., for example. Also, the sensor 14 may measure characteristic information of pixels, which is changed depending on an environment, according to the currents or voltages received through the receiving lines R1 to Rq. In an exemplary embodiment, the sensor 14 may measure characteristic information of pixels, which is changed depending on temperature or humidity, for example.

The pixel unit 15 includes pixels. Each pixel PXij may be connected to a corresponding data line, a corresponding scan line, a corresponding sensing line, and a corresponding receiving line. Here, i may be a natural number equal to or less than p, and j may be a natural number equal to or less than q. In an exemplary embodiment, the pixel PXij may mean a pixel circuit including a scan transistor connected to an ith scan line and a jth data line, for example. A threshold voltage of a driving transistor (refer to M1 shown in FIG. 7) of each pixel PXij may be compensated using an external compensation method, and a mobility deviation of the driving transistor may be compensated using an internal compensation method.

Figure 2:
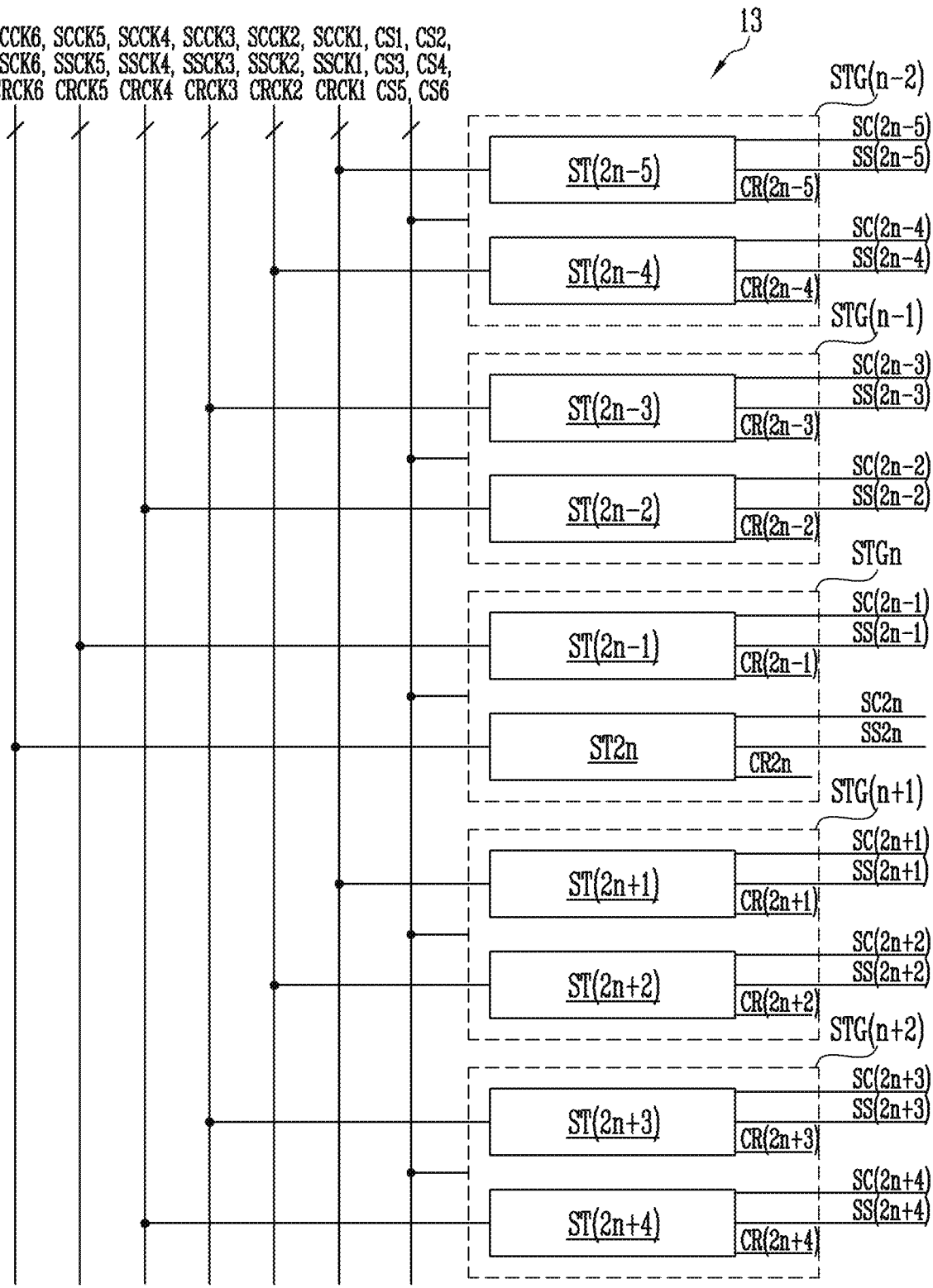
FIG. 2 is a diagram illustrating an exemplary embodiment of a scan driver in accordance with the invention.

FIG. 2 is a diagram illustrating an exemplary embodiment of a scan driver in accordance with the invention.

Referring to FIG. 2, the scan driver 13 may include a plurality of stage groups STG(n−2), STG(n−1), STGn, STG(n+1), and STG(n+2). In FIG. 2, only a portion of the scan driver 13, which is necessary for description, is illustrated.

Each of the stage groups STG(n−2), STG(n−1), STGn, STG(n+1), and STG(n+2) may include a first stage and a second stage. In an exemplary embodiment, the first stage may be an odd-numbered stage, and the second stage may be an even-numbered stage. In another exemplary embodiment, the first stage may be an even-numbered stage, and the second stage may be an odd-numbered stage. In an exemplary embodiment, a stage group STG(n−2) may include a first stage ST(2n−5) and a second stage ST(n−4), a stage group STG(n−1) may include a first stage ST(n−3) and a second stage ST(n−2), a stage group STGn may include a first stage ST(n−1) and a second stage ST2n, a stage group STG(n+1) may include a first stage ST(2n+1) and a second stage ST(2n+2), and a stage group STG(n+2) may include a first stage ST(2n+3) and a second stage ST(2n+4), for example. Here, n may be a natural number greater than two.

Each of the stages ST(2n−5) to ST(2n+4) may be connected to first to sixth control lines CS1, CS2, CS3, CS4, CS5, and CS6. Common control signals may be applied to the stages ST(2n−5) to ST(2n+4) through the first to sixth control lines CS1, CS2, CS3, CS4, CS5, and CS6.

Each of the stages ST(2n−5) to ST(2n+4) may be connected to corresponding clock lines among scan clock lines SCCK1, SCCK2, SCCK3, SCCK4, SCCK5, and SCCK6, sensing clock lines SSCK1, SSCK2, SSCK3, SSCK4, SSCK5, and SSCK6, and carry clock lines CRCK1, CRCK2, CRCK3, CRCK4, CRCK5, and CRCK6.

In an exemplary embodiment, the first stage (hereinafter, also referred to as "scan stage") ST(2n−5) may be connected to a scan clock line SCCK1, a sensing clock line SSCK1, and a carry clock line CRCK1, and the second stage ST(2n−4) may be connected to a scan clock line SCCK2, a sensing clock line SSCK2, and a carry block line CRCK2. The first stage ST(2n−3) may be connected to a scan clock line SCCK3, a sensing clock line SSCK3, and a carry clock line CRCK3, and the second stage ST(2n−2) may be connected to a scan clock line SCCK4, a sensing clock line SSCK4, and a carry clock line CRCK4, for example. The first stage ST(2n−1) may be connected to a scan clock line SCCK5, a sensing clock line SSCK5, and a carry clock line CRCK5, and the second stage ST2n may be connected to a scan clock line SCCK6, a sensing clock line SSCK6, and a carry clock line CRCK6.

In addition, iteratively, the first stage ST(2n+1) may be connected to the scan clock line SCCK1, a sensing clock line SSCK1, and a carry clock line CRCK1, and the second stage ST(2n+2) may be connected to the scan clock line SCCK2, the sensing clock line SSCK2, and the carry clock line CRCK2. The first stage ST(2n+3) may be connected to the scan clock line SCCK3, the sensing clock line SSCK3, and the carry clock line CRCK3, and the second stage ST(2n+4) may be connected to the scan clock line SCCK4, the sensing clock line SSCK4, and the carry clock line CRCK4.

Input signals for the respective scan stages ST(2n−5) to ST(2n+4) are applied to the first to sixth control lines CS1 to CS6, the scan clock lines SCCK1 to SCCK6, the sensing clock lines SSCK1 to SSCK6, and the carry clock lines CRCK1 to CRCK6.

Each of the scan stages ST(2n−5) to ST(2n+4) may be connected to corresponding lines among scan lines SC(2n−5) to SC(2n+4), sensing lines SS(2n−5) to SS(2n+4), and carry lines CR(2n−5) to CR(2n+4).

In an exemplary embodiment, the first stage ST(2n−5) may be connected to a scan line SC(2n−5), a sensing line SS(2n−5), and carry line CR(2n−5), the second stage ST(2n−4) may be connected to a scan line SC(2n−4), a sensing line SS(2n−4), and a carry line CR(2n−4), for example. The first stage ST(2n−3) may be connected to a scan line SC(2n−3), a sensing line SS(2n−3), and a carry line CR(2n−3), and the second stage ST(2n−2) may be connected to a scan line SC(2n−2), a sensing line SS (2n−2), and a carry line CR(2n−2).

Output signals generated by the respective scan stages ST(2n−5) to ST(2n+4) are applied to the scan lines SC(2n−5) to SC(2n+4), the sensing lines SS(2n−5) to SS(2n+4), and the carry lines CR(2n−5) to CR(2n+4).

Figure 3:
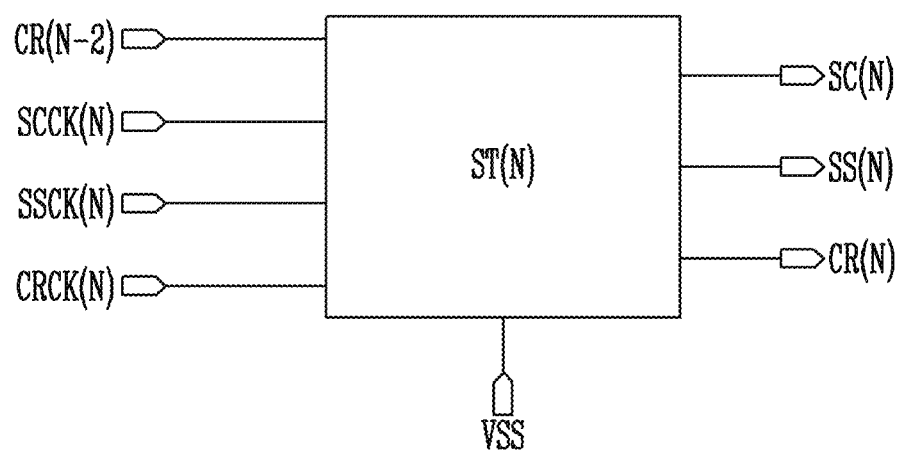
FIG. 3 is a diagram schematically illustrating terminals connected to one stage shown in FIG. 2.

FIG. 3 is a diagram schematically illustrating terminals connected to one stage shown in FIG. 2. In FIG. 3, an Nth stage ST(N) disposed on an Nth row is illustrated for convenience of description. Here, N is a natural number which is greater than 2 and equal to or less than p.

Referring to FIG. 3, the Nth stage ST(N) may include input terminals respectively connected to a carry line CR(N−2), a scan clock line SCCK(N), a sensing clock line SSCK(N), and a carry clock line CRCK(N), include output terminals respectively connected to a carry line CR(N), a scan line SC(N), and a sensing line SS(N), and further include an input terminal connected to a power line VSS.

In some exemplary embodiments, the input terminal connected to the power line VSS may include input terminals respectively connected to a plurality of power lines. In an exemplary embodiment, the input terminals respectively connected to the plurality of power lines may be input terminals connected to a first power line VSS1, a second power line VSS2 (refer to FIG. 4), and a third power line VSS3 (refer to FIG. 4), which will be described later, for example. Hereinafter, a case where the Nth stage ST(N) includes input terminals connected to the first power line VSS1, the second power line VSS2, and the third power line VSS3 is described as an example.

In an exemplary embodiment, a carry signal output to the output terminal connected to the carry line CR(N) of the Nth stage ST(N) may be provided to an input terminal of an (N+2)th stage. That is, a carry signal provided to the input terminal connected to the carry line CR(N−2) of the Nth stage ST(N) may be a signal provided from an output terminal of the (N−2)th stage. However, the number of a next stage to which a carry signal is transferred is not limited.

Figure 4:
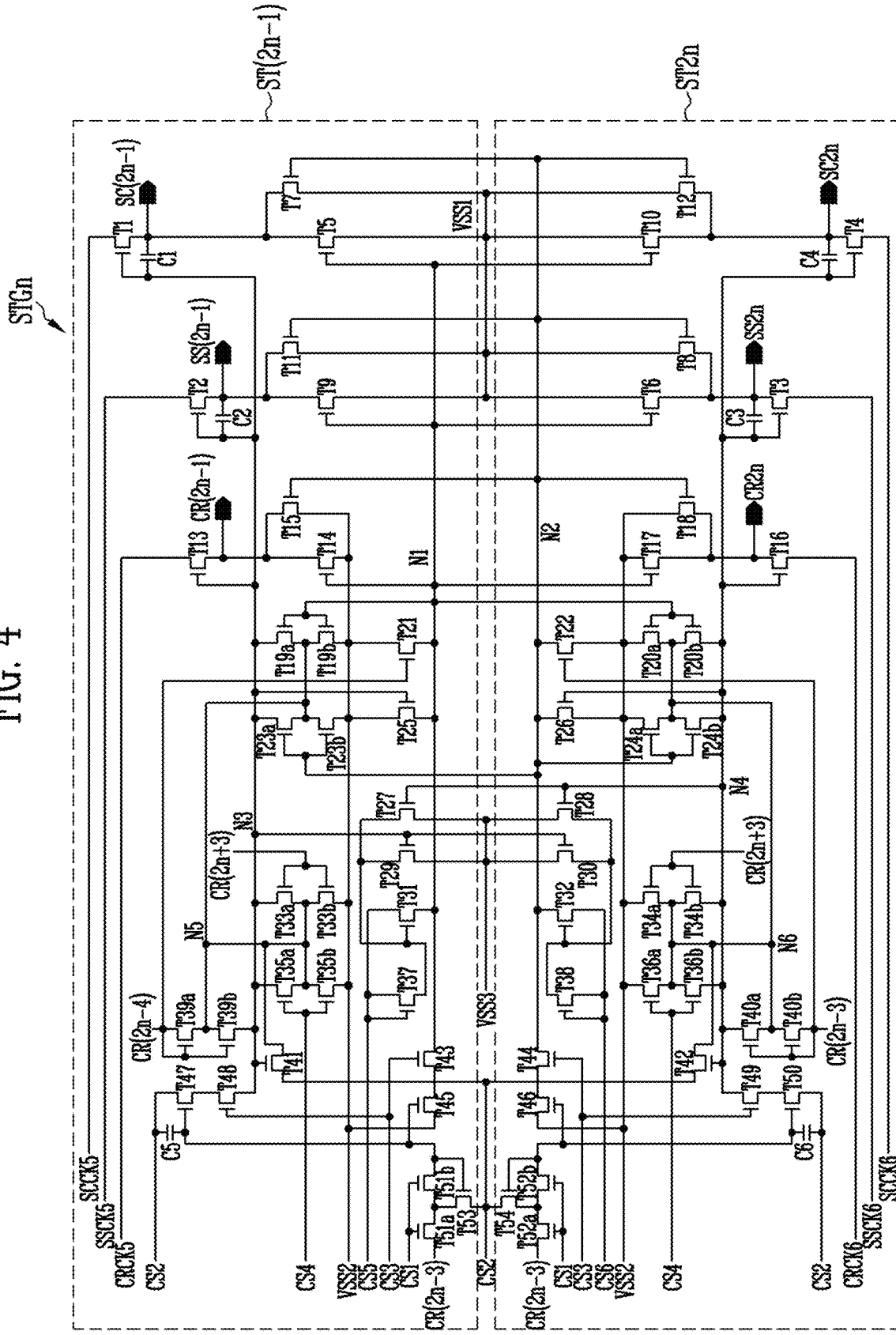
FIG. 4 is a circuit diagram illustrating an exemplary embodiment of a stage group in accordance with the invention.

FIG. 4 is a circuit diagram illustrating an exemplary embodiment of a stage group in accordance with the invention. A circuit diagram of each stage shown in FIG. 4 is an exemplary circuit diagram to which the drawing shown in FIG. 3 may be applied, and a circuit diagram of another stage known in the art may be applied.

Referring to FIG. 4, the stage group STGn including the first stage ST(2n−1) and the second stage ST2n is exemplarily illustrated. The other stage groups shown in FIG. 2 may be configured substantially identically to the stage group STGn shown in FIG. 4, and therefore, overlapping descriptions will be omitted.

In drawings from FIG. 4, a case where transistors are implemented with an N-type transistor (e.g., a n-type metal-oxide-semiconductor ("NMOS") transistor) is assumed and described, but those skilled in the art may implement the stage group STGn by replacing some or all of the transistors with a P-type transistor (e.g., a p-type metal-oxide-semiconductor ("PMOS") transistor).

A first electrode of a first transistor T1 may be connected to a scan line SC(2n−1), a second electrode of the first transistor T1 may be connected to the scan clock line SCCK5, and a gate electrode of the first transistor T1 may be connected to a third node N3.

A first electrode of a second transistor T2 may be connected to a sensing line SS(2n−1), a second electrode of the second transistor T2 may be connected to the sensing clock line SSCK5, and a gate electrode of the second transistor T2 may be connected to the third node N3.

A first electrode of a third transistor T3 may be connected to a sensing line SS2$n$, a second electrode of the third transistor T3 may be connected to the sensing clock line SSCK6, and a gate electrode of the third transistor T3 may be connected to a fourth node N4.

A first electrode of a fourth transistor T4 may be connected to a scan line SC2$n$, a second electrode of the fourth transistor T4 may be connected to the scan clock line SCCK6, and a gate electrode of the fourth transistor T4 may be connected to a fourth node N4.

A first electrode of a fifth transistor T5 may be connected to a first power line VSS1, a second electrode of the fifth transistor T5 may be connected to the first electrode of the first transistor T1, and a gate electrode of the fifth transistor T5 may be connected to a first node N1.

A first electrode of a sixth transistor T6 may be connected to the first power line VSS1, a second electrode of the sixth transistor T6 may be connected to the first electrode of the third transistor T3, and a gate electrode of the sixth transistor T6 may be connected to the first node N1.

A first electrode of a seventh transistor T7 may be connected to the first power line VSS1, a second electrode of the seventh transistor T7 may be connected to the first transistor T1, and a gate electrode of the seventh transistor T7 may be connected to a second node N2.

A first electrode of an eighth transistor T8 may be connected to the first power line VSS1, a second electrode of the eighth transistor T8 may be connected to the first electrode of the third transistor T3, and a gate electrode of the eighth transistor T8 may be connected to the second node N2.

A first electrode of a ninth transistor T9 may be connected to the first power line VSS1, a second electrode of the ninth transistor T9 may be connected to the first electrode of the second transistor T2, and a gate electrode of the ninth transistor T9 may be connected to the first node N1.

A first electrode of a tenth transistor T10 may be connected to the first power line VSS1, a second electrode of the tenth transistor T10 may be connected to the first electrode of the fourth transistor T4, and a gate electrode of the tenth transistor T10 may be connected to the first node N1.

A first electrode of an eleventh transistor T11 may be connected to the first power line VSS1, a second electrode of the eleventh transistor T11 may be connected to the first electrode of the second transistor T2, and a gate electrode of the eleventh transistor T11 may be connected to the second node N2.

A first electrode of a twelfth transistor T12 may be connected to the first power line VSS1, a second electrode of the twelfth transistor T12 may be connected to the first electrode of the fourth transistor T4, and a gate electrode of the twelfth transistor T12 may be connected to the second node N2.

A first electrode of a thirteenth transistor T13 may be connected to a carry line CR(2$n$−1), a second electrode of the thirteenth transistor T13 may be connected to the carry clock line CRCK5, and a gate electrode of the thirteenth transistor T13 may be connected to the third node N3.

A first electrode of a fourteenth transistor T14 may be connected to a second power line VSS2, a second electrode of the fourteenth transistor T14 may be connected to the first electrode of the thirteenth transistor T13, and a gate electrode of the fourteenth transistor T14 may be connected to first node N1.

A first electrode of a fifteenth transistor T15 may be connected to the second power line VSS2, a second electrode of the fifteenth transistor T15 may be connected to the first electrode of the thirteenth transistor T13, and a gate electrode of the fifteenth transistor T15 may be connected to the second node N2.

A first electrode of a sixteenth transistor T16 may be connected to a carry line CR2$n$, a second electrode of the sixteenth transistor T16 may be connected to the carry clock line CRCK6, and a gate electrode of the sixteenth transistor T16 may be connected to the fourth node N4.

A first electrode of a seventeenth transistor T17 may be connected to the second power line VSS2, a second electrode of the seventeenth transistor T17 may be connected to the first electrode of the sixteenth transistor T16, and a gate electrode of the seventeenth transistor T17 may be connected to the first node N1.

A first electrode of an eighteenth transistor T18 may be connected to the second power line VSS2, a second electrode of the eighteenth transistor T18 may be connected to the first electrode of the sixteenth transistor T16, and a gate electrode of the eighteenth transistor T18 may be connected to the second node N2.

A first electrode of a nineteenth transistor may be connected to the second power line VSS2, a second electrode of the nineteenth transistor may be connected to the third node N3, and a gate electrode of the nineteenth transistor may be connected to the first node N1. In some exemplary embodiments, the nineteenth transistor may include sub-transistors T19$a$ and T19$b$ connected in series. An appropriate intermediate voltage is applied to a fifth node N5, so that the nineteenth transistor may prevent degradation due to an excessive voltage difference between a drain electrode and a source electrode.

A first electrode of a twentieth transistor may be connected to the second power line VSS2, a second electrode of the twentieth transistor may be connected to the fourth node N4, and a gate electrode of the twentieth transistor may be connected to the first node N1. In some exemplary embodiments, the twentieth transistor may include sub-transistors T20$a$ and T20$b$ connected in series. An appropriate intermediate voltage is applied to a sixth node N6, so that the twentieth transistor may prevent degradation due to an excessive voltage difference between a drain electrode and a source electrode.

A first electrode of a twenty-first transistor T21 may be connected to the first node N1, a second electrode of the twenty-first transistor T21 may be connected to the second power line VSS2, and a gate electrode of the twenty-first transistor T21 may be connected to the carry line CR(2$n$−4). In some exemplary embodiments, the gate electrode of the twenty-first transistor T21 may be connected to another carry line.

A first electrode of a twenty-second transistor T22 may be connected to the second node N2, a second electrode of the twenty-second transistor T22 may be connected to the second power line VSS2, and a gate electrode of the twenty-second transistor T22 may be connected to the carry line CR(2$n$−3). In some exemplary embodiments, the gate electrode of the twenty-second transistor T22 may be connected to another carry line.

A first electrode of a twenty-third transistor may be connected to the second power line VSS2, a second electrode of the twenty-third transistor may be connected to the third node N3, and a gate electrode of the twenty-third transistor may be connected to the second node N2. In some exemplary embodiments, the twenty-third transistor may include sub-transistors T23a and T23b connected in series. An appropriate intermediate voltage is applied to the fifth node N5, so that the twenty-third transistor may prevent degradation due to an excessive voltage difference between a drain electrode and a source electrode.

A first electrode of a twenty-fourth transistor may be connected to the second power line VSS2, a second electrode of the twenty-fourth transistor may be connected to the fourth node N4, and a gate electrode of the twenty-fourth transistor may be connected to the second node N2. In some exemplary embodiments, the twenty-fourth transistor may include sub-transistors T24a and T24b connected in series.

An appropriate intermediate voltage is applied to the sixth node N6, so that the twenty-fourth transistor may prevent degradation due to an excessive voltage difference between a drain electrode and a source electrode.

A first electrode of a twenty-fifth transistor T25 may be connected to the first node N1, a second electrode of the twenty-fifth transistor T25 may be connected to the second power line VSS2, and a gate electrode of the twenty-fifth transistor T25 may be connected to the third node N3.

A first electrode of a twenty-sixth transistor T26 may be connected to the second node N2, a second electrode of the twenty-sixth transistor T26 may be connected to the second power line VSS2, and a gate electrode of the twenty-sixth transistor T26 may be connected to the fourth node N4.

A first electrode of a twenty-seventh transistor T27 may be connected to a third power line VSS3, a second electrode of the twenty-seventh transistor T27 may be connected to a gate electrode of a thirty-first transistor T31, and a gate electrode of the twenty-seventh transistor T27 may be connected to the fourth node N4.

A first electrode of a twenty-eighth transistor T28 may be connected to the third power line VSS3, a second electrode of the twenty-eighth transistor T28 may be connected to a gate electrode of a thirty-second transistor T32, and a gate electrode of the twenty-eighth transistor T28 may be connected to the fourth node N4.

A first electrode of a twenty-ninth transistor T29 may be connected to the third power line VSS3, a second electrode of the twenty-ninth transistor T29 may be connected to the gate electrode of the thirty-first transistor T31, and a gate electrode of the twenty-ninth transistor T29 may be connected to the third node N3.

A first electrode of a thirtieth transistor T30 may be connected to the third power line VSS3, a second electrode of the thirtieth transistor T30 may be connected to the gate electrode of the thirty-second transistor T32, and a gate electrode of the thirtieth transistor T30 may be connected to the third node N3.

A first electrode of the thirty-first transistor T31 may be connected to the first node N1, a second electrode of the thirty-first transistor T31 may be connected to the fifth control line CS5, and the thirty-first transistor T31 may include the gate electrode.

A first electrode of the thirty-second transistor T32 may be connected to the second node N2, a second electrode of the thirty-second transistor T32 may be connected to the sixth control line CS6, and the thirty-second transistor T32 may include the gate electrode.

A first electrode of a thirty-third transistor may be connected to the second power line VSS2, a second electrode of the thirty-third transistor may be connected to the third node N3, and a gate electrode of the thirty-third transistor may be connected to a carry line $CR(2n+3)$. In some exemplary embodiments, the thirty-third transistor may include sub-transistors T33a and T33b connected in series. An appropriate intermediate voltage is applied to the fifth node N5, so that the thirty-third transistor may prevent degradation due to an excessive voltage difference between a drain electrode and a source electrode. In some exemplary embodiments, the gate electrode of the thirty-third transistor may be connected to another carry line.

A first electrode of a thirty-fourth transistor may be connected to the second power line VSS2, a second electrode of the thirty-fourth transistor may be connected to the fourth node N4, and a gate electrode of the thirty-fourth transistor may be connected to the carry line $CR(2n+3)$. In some exemplary embodiments, the thirty-fourth transistor may include sub-transistors T34a and T34b connected in series. An appropriate intermediate voltage is applied to the sixth node N6, so that the thirty-fourth transistor may prevent degradation due to an excessive voltage difference between a drain electrode and a source electrode. In some exemplary embodiments, the gate electrode of the thirty-fourth transistor may be connected to another carry line.

A first electrode of a thirty-fifth transistor may be connected to the second power line VSS2, a second electrode of the thirty-fifth transistor may be connected to the third node N3, and a gate electrode of the thirty-fifth transistor may be connected to the fourth control line CS4. In some exemplary embodiments, the thirty-fifth transistor may include sub-transistors T35a and T35b connected in series. An appropriate intermediate voltage is applied to the fifth node N5, so that the thirty-fifth transistor may prevent degradation due to an excessive voltage difference between a drain electrode and a source electrode.

A first electrode of a thirty-sixth transistor may be connected to the second power line VSS2, a second electrode of the thirty-sixth transistor may be connected to the fourth node N4, and a gate electrode of the thirty-sixth transistor may be connected to the fourth control line CS4. In some exemplary embodiments, the thirty-sixth transistor may include sub-transistors T36a and T36b connected in series. An appropriate intermediate voltage is applied to the sixth node N6, so that the thirty-sixth transistor may prevent degradation due to an excessive voltage difference between a drain electrode and a source electrode.

A first electrode of a thirty-seventh transistor T37 may be connected to the gate electrode of the thirty-first transistor T31, and a second electrode and a gate electrode of the thirty-seventh transistor T37 may be connected to the fifth control line CS5.

A first electrode of a thirty-eighth transistor T38 may be connected to the gate electrode of the thirty-second transistor T32, and a second electrode and a gate electrode of the thirty-eighth transistor T38 may be connected to the sixth control line CS6.

A first electrode of a thirty-ninth transistor may be connected to the third node N3, and a second electrode and a gate electrode of the thirty-ninth transistor may be connected to the carry line $CR(2n-4)$. In some exemplary embodiments, the thirty-ninth transistor may include sub-transistors T39a and T39b connected in series. An appropriate intermediate voltage is applied to the fifth node N5, so that the thirty-ninth transistor may prevent degradation due to an excessive voltage difference between a drain electrode and a source electrode. In some exemplary embodiments, the gate electrode of the thirty-ninth transistor may be connected to another carry line.

A first electrode of a fortieth transistor may be connected to the fourth node N4, and a second electrode and a gate electrode of the fortieth transistor may be connected to the carry line $CR(2n-3)$. In some exemplary embodiments, the fortieth transistor may include sub-transistors T40a and T40b connected in series. An appropriate intermediate voltage is applied to the sixth node N6, so that the fortieth transistor may prevent degradation due to an excessive voltage difference between a drain electrode and a source electrode. In some exemplary embodiments, the gate electrode of the fortieth transistor may be connected to another carry line.

A first electrode of a forty-first transistor T41 may be connected to the fifth node N5, a second electrode of the forty-first transistor T41 may be connected to a second control line CS2, and a gate electrode of the forty-first transistor T41 may be connected to the third node N3.

A first electrode of a forty-second transistor T42 may be connected to the sixth node N6, a second electrode of the forty-second transistor T42 may be connected to the second control line CS2, and a gate electrode of the forty-second transistor T42 may be connected to the fourth node N4.

A first electrode of a forty-third transistor T43 may be connected to the first node N1, a second electrode of the forty-third transistor T43 may be connected to a first electrode of a forty-fifth transistor T45, and a gate electrode of the forty-third transistor T43 may be connected to a third control line CS3.

A first electrode of a forty-fourth transistor T44 may be connected to the second node N2, a second electrode of the forty-fourth transistor T44 may be connected to a first electrode of a forty-sixth transistor T46, and a gate electrode of the forty-fourth transistor T44 may be connected to the third control line CS3.

The first electrode of the forty-fifth transistor T45 may be connected to the second electrode of the forty-third transistor T43, a second electrode of the forty-fifth transistor T45 may be connected to the second power line VSS2, and a gate electrode of the forty-fifth transistor T45 may be connected to a first electrode of a fifty-first transistor.

The first electrode of the forty-sixth transistor T46 may be connected to the second electrode of the forty-fourth transistor T44, a second electrode of the forty-sixth transistor T46 may be connected to the second power line VSS2, and a gate electrode of the forty-sixth transistor T46 may be connected to a first electrode of a fifty-second transistor.

A first electrode of a forty-seventh transistor T47 may be connected to a second electrode of a forty-eighth transistor T48, a second electrode of the forty-seventh transistor T47 may be connected to the second control line CS2, and a gate electrode of the forty-seventh transistor T47 may be connected to the first electrode of fifty-first transistor.

A first electrode of the forty-eighth transistor T48 may be connected to the third node N3, the second electrode of the forty-eighth transistor T48 may be connected to the first electrode of the forty-seventh transistor T47, and a gate electrode of the forty-eighth transistor T48 may be connected to the third control line CS3.

A first electrode of a forty-ninth transistor T49 may be connected to the fourth node N4, a second electrode of the forty-ninth transistor T49 may be connected to a first electrode of a fiftieth transistor T50, and a gate electrode of the forty-ninth transistor T49 may be connected to the third control line CS3.

The first electrode of the fiftieth transistor T50 may be connected to the second electrode of the forty-ninth transistor T49, a second electrode of the fiftieth transistor T50 may be connected to the second control line CS2, and a gate electrode of the fiftieth transistor T50 may be connected to the first electrode of the fifty-second transistor.

The fifty-first transistor may include the first electrode, a second electrode of the fifty-first transistor may be connected to the carry line CR(2n−3), and a gate electrode of the fifty-first transistor may be connected to the first control line CS1. The fifty-first transistor may include sub-transistors T51a and T51b connected in series. In some exemplary embodiments, the gate electrode of the fifty-first transistor may be connected to another carry line.

The fifty-second transistor may include the first electrode, a second electrode of the fifty-second transistor may be connected to the carry line CR(2n−3), and a gate electrode of the fifty-second transistor may be connected to the first control line CS1. The fifty-second transistor may include sub-transistors T52a and T52b connected in series. In some exemplary embodiments, the gate electrode of the fifty-second transistor may be connected to another carry line.

A first electrode of a fifty-third transistor T53 may be connected to the second control line CS2, a second electrode of the fifty-third transistor T53 may be connected to a second electrode of the sub-transistor T51b, and a gate electrode of the fifty-third transistor T53 may be connected to a first electrode of the sub-transistor T51b.

A first electrode of a fifty-fourth transistor T54 may be connected to the second control line CS2, a second electrode of the fifty-fourth transistor T54 may be connected to a second electrode of the sub-transistor T52b, and a gate electrode of the fifty-fourth transistor T54 may be connected to a first electrode of the sub-transistor T52b.

A first electrode of a first capacitor C1 may be connected to the first electrode of the first transistor T1, and a second electrode of the first capacitor C1 may be connected to the gate electrode of the first transistor T1.

A first electrode of a second capacitor C2 may be connected to the first electrode of the second transistor T2, and a second electrode of the second capacitor C2 may be connected to the gate electrode of the second transistor T2.

A first electrode of a third capacitor C3 may be connected to the first electrode of the third transistor T3, and a second electrode of the third capacitor C3 may be connected to the gate electrode of the third transistor T3.

A first electrode of a fourth capacitor C4 may be connected to the first electrode of the fourth transistor T4, and a second electrode of the fourth capacitor C4 may be connected to the gate electrode of the fourth transistor T4.

A first electrode of a fifth capacitor C5 may be connected to the gate electrode of the forty-seventh transistor T47, and a second electrode of the fifth capacitor C5 may be connected to the second electrode of the forty-seventh transistor T47.

A first electrode of a sixth capacitor C6 may be connected to the gate electrode of the fiftieth transistor T50, and a second electrode of the sixth capacitor C6 may be connected to the second electrode of the fiftieth transistor T50.

Figure 6:
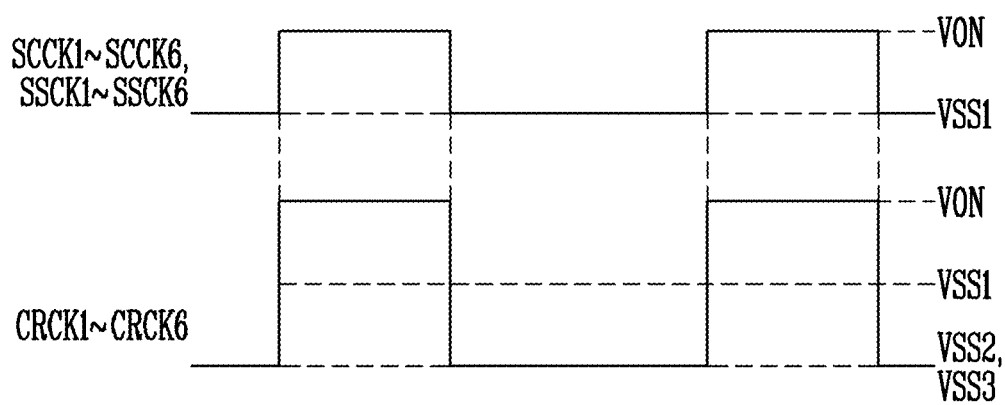

FIGS. 5 and 6 are timing diagrams illustrating an exemplary driving method of the scan driver in a display period.

Referring to FIG. 5, signals are illustrated, which are applied to the first control line CS1, the fourth control line CS4, the scan clock lines SCCK1 to SCCK6, the sensing clock lines SSCK1 to SSCK6, the carry clock lines CRCK1 to CRCK6, the first scan carry line CR(2n−4), the first sensing carry line CR(2n−3), the first scan line SC(2n−1), the second scan line SC2n, the first sensing line SS(2n−1), the second sensing line SS2n, the first carry line CR(2n−1), and the second carry line CR2n.

In the display period, a scan clock signal, a sensing clock signal, and a carry clock signal, which are respectively applied to a scan clock line, a sensing clock line, and a carry clock line, which are connected to the same scan stage, may have the same phase. Therefore, in FIG. 5, a signal of the first clock lines SCCK1, SSCK1, and CRCK1 is commonly illustrated, a signal of the second clock lines SCCK2, SSCK2, and CRCK2 is commonly illustrated, a signal of the third clock lines SCCK3, SSCK3, and CRCK3 is commonly illustrated, a signal of the fourth clock lines SCCK4, SSCK4, and CRCK4 is commonly illustrated, a signal of the fifth clock lines SCCK5, SSCK5, and CRCK5 is commonly illustrated, and a signal of the sixth clock lines SCCK6, SSCK6, and CRCK6 is commonly illustrated.

However, referring to FIG. 6, the scan clock signal, the sensing clock signal, and the carry clock signal, which are respectively applied to the scan clock line, the sensing clock line, and the carry clock line, which are connected to the same scan stage, may have different magnitudes. In an exemplary embodiment, a low level of the scan clock signals and the sensing clock signals may correspond to the magnitude of a voltage applied to the first power line VSS1, and a high level of the scan clock signals and the sensing clock signals may correspond to the magnitude of a gate-on voltage VON, for example. In addition, a low level of the carry clock signals may correspond to the magnitude of a voltage applied to the second power line VSS2 or the third power line VSS3, and a high level of the carry clock signals may correspond to the magnitude of the gate-on voltage VON. In an exemplary embodiment, the voltage applied to the first power line VSS1 may be higher than that applied to the second power line VSS2 or the third power line VSS3, for example.

The magnitude of the gate-on voltage VON may be a magnitude sufficient to turn on the transistors, and the magnitude of each of the voltages applied to the power lines VSS1, VSS2, and VSS3 may have a magnitude sufficient to turn off the transistors. Hereinafter, a voltage level (or a voltage having a turn-on level) corresponding to the magnitude of the gate-on voltage VON may be expressed as the high level, and a voltage level (or a voltage having a turn-off level) corresponding to the magnitude of each of the voltages applied to the power lines VSS1, VSS2, and VSS3 may be expressed as the low level.

Referring back to FIG. 5, high-level pulses of the clock lines SCCK2, SSCK2, and CRCK2 have a phase delayed from those of the clock lines SCCK1, SSCK1, and CRCK1, and the high-level pulses of the clock lines SCCK2, SSCK2, and CRCK2 and the high-level pulses of the clock lines SCCK1, SSCK1, and CRCK1 may temporally partially overlap with each other. In an exemplary embodiment, the high-level pulses may have a length of two horizontal periods, and the overlapping length may correspond to one horizontal period, for example. Here, a horizontal period may be defined by a driving frame (frame rate) of the display device 10. When the display device 10 is driven at 120 hertz (Hz), the horizontal period may be about 3.8 microseconds (μs). Hereinafter, although the length of a period is described using, as an example, the case where the display device 10 is driven at 120 Hz, the driving frequency of the display device 10 is not limited thereto.

Similarly, high-level pulses of the clock lines SCCK3, SSCK3, and CRCK3 have a phase delayed from those of the clock lines SCCK2, SSCK2, and CRCK2, and the high-level pulses of the clock lines SCCK3, SSCK3, and CRCK3 and the high-level pulses of the clock lines SCCK2, SSCK2, and CRCK2 may temporally partially overlap with each other. High-level pulses of the clock lines SCCK4, SSCK4, and CRCK4 have a phase delayed from those of the clock lines SCCK3, SSCK3, and CRCK3, and the high-level pulses of the clock lines SCCK4, SSCK4, and CRCK4 and the high-level pulses of the lock lines SCCK3, SSCK3, and CRCK3 may temporally partially overlap with each other. High-level pulses of the clock lines SCCK5, SSCK5, and CRCK5 have a phase delayed from those of the clock lines SCCK4, SSCK4, and CRCK4, and the high-level pulses of the clock lines SCCK5, SSCK5, and CRCK5 and the high-level pulses of the clock lines SCCK4, SSCK4, and CRCK4 may temporally partially overlap with each other. High-level pulses of the clock lines SCCK6, SSCK6, and CRCK6 have a phase delayed from those of the clock lines SCCK5, SSCK5, and CRCK5, and the high-level pulses of the clock lines SCCK6, SSCK6, and CRCK6 and the high-level pulses of the clock lines SCCK5, SSCK5, and CRCK5 may temporally partially overlap with each other. In addition, iteratively, the high-level pulses of the clock lines SCCK1, SSCK1, and CRCK1 have a phase delayed from those of the sixth clock lines SCCK6, SSCK6, and CRCK6, and the high-level pulses of the clock lines SCCK1, SSCK1, and CRCK1 and the high-level pulses of the clock lines SCCK6, SSCK6, and CRCK6 may temporally partially overlap with each other.

Hereinafter, an operation of the first stage ST($2n-1$) in the display period will be described. Operations of the other stages are similar to that of the first stage ST($2n-1$), and therefore, overlapping descriptions will be omitted.

First, a high-level pulse may be applied to the fourth control line CS4. Therefore, the thirty-fifth transistor may be turned on, and a voltage of the third node N3 may be discharged to the low level.

After a predetermined time elapses, at a time t1, a high-level pulse may be generated in the carry line CR($2n-4$). Accordingly, the thirty-ninth transistor is turned on, and the third node N3 is charged to the high level. The forty-first transistor T41 may be turned on, and the fifth node N5 may be charged to a high-level voltage applied to the second control line CS2.

Next, at a time t2, a high-level pulse is generated in the first control line CS1, and therefore, the fifty-first transistor may be turned on. Since a high-level pulse is generated in the carry line CR($2n-3$), a high-level voltage may be charged in the first electrode of the fifth capacitor C5 through the fifty-first transistor.

Next, at a time t3, high-level pulses are generated in the clock lines SCCK5, SSCK5, and CRCK5. Therefore, the voltage of the third node N3 may be boosted higher than the high level by the capacitors C1 and C2, and a high-level pulse may be output to the scan line SC($2n-1$), the sensing line SS($2n-2$), and the carry line CR($2n-1$).

Since the high-level voltage is applied to the fifth node N5 in spite of the voltage boosting of the third node N3, voltage differences between the drain electrodes and the source electrodes of the transistors T19$a$, T19$b$, T23$a$, T23$b$, T33$a$, T33$b$, T35$a$, T35$b$, T39$a$, and T39$b$ are not relatively large. Thus, degradation of the transistors T19$a$, T19$b$, T23$a$, T23$b$, T33$a$, T33$b$, T35$a$, T35$b$, T39$a$, and T39$b$ may be prevented.

In a similar manner, when a high-level pulse is generated in the clock lines SCCK6, SSCK6, and CRCK6, high-level pulses may be output from the scan line SC$2n$, the sensing line SS$2n$, and the carry line CR$2n$ of the second stage ST$2n$.

Although not shown in the drawing, when a high-level pulse is applied through the carry line CR($2n+3$), the third node N3 is connected to the second power line VSS2 through the thirty-third transistor, and therefore, the voltage of the third node N3 may be discharged to the low level.

Also, although not shown in the drawing, a high-level control signal may be alternately applied to the fifth control line CS5 and the sixth control line CS6 in a predetermined period unit. The predetermined period unit may correspond to, for example, a plurality of frames.

In an exemplary embodiment, during a first period, a high-level control signal may be applied to the fifth control lien CS5, and a low-level control signal may be applied to the sixth control line CS6, for example. The transistors T31 and T37 may be turned on such that the first node N1 is charged to the high level. Therefore, the nineteenth transistor may be turned on to discharge the third node N3 to the low level, the fourteenth transistor T14 may be turned on to discharge the carry line CR(2n−1) to the low level, the ninth transistor T9 may be turned on to discharge the sensing line SS(2n−1) to the low level, and the fifth transistor T5 may be turned on to discharge the scan line SC(2n−1) to the low level.

In addition, during a second period next to the first period, a low-level control signal may be applied to the fifth control line CS5, and a high-level control signal may be applied to the sixth control line CS6. The transistors T32 and T38 may be turned on such that the second node N2 is charged to the high level. Therefore, the twenty-third transistor may be turned on to discharge the third node N3 to the low level, the fifteenth transistor T15 may be turned on to discharge the carry line CR(2n−2) to the low level, the eleventh transistor T11 may be turned on to discharge the sensing line SS(2n−1) to the low level, and the seventh transistor T7 may be turned on to discharge the scan line SC(2n−1) to the low level.

With respect to the first period and the second period, different transistors may be used for the discharge of the third node N3, the carry line CR(2n−1), the sensing line SS(2n−1), and the scan line SC(2n−1). Accordingly, a period in which an on-bias is applied to the corresponding transistors is shortened, so that degradation of the corresponding transistors may be prevented.

Figure 7:
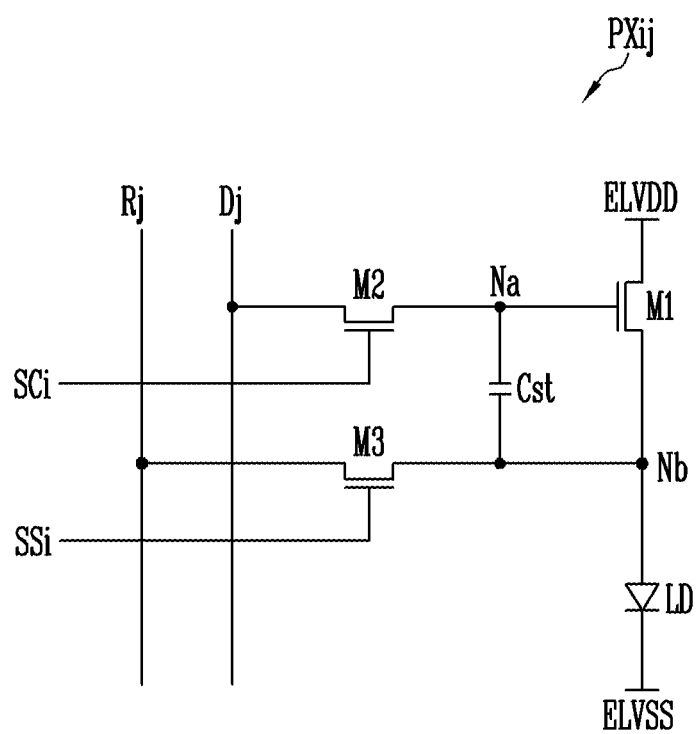
FIG. 7 is an equivalent circuit diagram illustrating an exemplary embodiment of a pixel in accordance with the invention.

FIG. 7 is an equivalent circuit diagram illustrating an exemplary embodiment of a pixel in accordance with the invention.

Referring to FIG. 7, the pixel PXij in the exemplary embodiment of the invention may include transistors M1, M2, and M3, a storage capacitor Cst, and a light emitting device LD. The transistors M1, M2, and M3 are illustrated as N-type transistors. However, in some exemplary embodiments, at least some of the transistors M1, M2, and M3 may be implemented with a P-type transistor.

A gate electrode of a transistor M1 may be connected to a node Na, a first electrode of the transistor M1 may be connected to a power line ELVDD, and a second electrode of the transistor M1 may be connected to a node Nb. The transistor M1 may be also referred to as a driving transistor.

A gate electrode of a transistor M2 may be connected to a scan line SCi, a first electrode of the transistor M2 may be connected to a data line Dj, a second electrode of the transistor M2 may be connected to the node Na. The transistor M2 may be also referred to as a switching transistor, a scan transistor, or the like.

A gate electrode of a transistor M3 may be connected to a sensing line SSi, a first electrode of the transistor M3 may be connected to a receiving line Rj, and a second electrode of the transistor M3 may be connected to the node Nb. The transistor M3 may be also referred to as an initialization transistor, a sensing transistor, or the like.

A first electrode of the storage capacitor Cst may be connected to the node Na, and a second electrode of the storage capacitor Cst may be connected to the node Nb.

An anode of the light emitting device LD may be connected to the node Nb, and a cathode of the light emitting device LD may be connected to a power line ELVSS. The light emitting device LD may be configured as an organic light emitting diode, an inorganic light emitting diode, a quantum dot ("QD") light emitting diode, or the like.

With reference to the description shown in FIG. 5, a high-level pulse may be applied to the scan line SCi and the sensing line SSi at least once during a display period of one frame. A corresponding data voltage may be applied to the data line Dj, and a first reference voltage may be applied to the receiving line Rj. Therefore, the storage capacitor Cst may store a voltage corresponding to the difference between the data voltage and the first reference voltage while the transistors M2 and M3 are in a turn-on state. Subsequently, although the transistors M2 and M3 are turned off, the voltage stored in the storage capacitor Cst may be maintained. An amount of driving current flowing through the transistor M1 is determined according to the voltage stored in the storage capacitor Cst, and the light emitting device LD emits light with a luminance corresponding to the amount of driving current.

FIG. 8 is a timing diagram illustrating an exemplary driving method of the scan driver in a sensing period.

Referring to FIG. 8, signals are illustrated, which are applied to the third control line CS3, the scan clock line SCCK5, the sensing clock line SSCK, other clock lines Other CKs, the scan lines SC(2n−1) and SC2n, the sensing lines SS(2n−1) and SS2n, and carry lines CR(2n−1) and CR2n. In addition, the first stage ST(2n−1) shown in FIG. 2 corresponds to a stage which is second-to-last with respect to the first stage ST(2n+1). The input terminals and the output terminals, which are shown in FIG. 3, may be applied to those of each of the stages ST(2n−1) and ST(2n+1).

At a time t4, a high-level pulse may be generated in the third control line CS3. Accordingly, the forty-eighth transistor T48 may be turned on. Since the fifth capacitor C5 is in a state in which a voltage is charged in the fifth capacitor C5 during the above-described period t2 to t3, the forty-seventh transistor T47 may be in the turn-on state. Accordingly, a high-level voltage applied to the second control line CS2 may be applied to the third node N3 through the transistors T47 and T48.

In the other first stages except the first stage ST(2n−1), the forty-seventh transistor T47 is in a turn-off state, and hence the third node N3 may maintain the low level.

Next, at a time t5, a high-level signal may be applied to the scan clock line SCCK5, the sensing clock line SSCK5, and the carry clock line CRCK5. Therefore, the voltage of the third node N3 may be boosted by the capacitors C1 and C2, and a high-level signal may be output to the scan line SC(2n−1), the sensing line SS(2n−1), and the carry line CR(2n−1).

Accordingly, the transistors M2 and M3 of pixels connected to the scan line SC(2n−1) and the sensing line SS(2n−1) may be turned on. A second reference voltage may be applied to the data lines. The sensor 14 may measure degradation information or characteristic information of pixels according to current values or voltage values received through the receiving lines R1, R2, R3, . . . , Rj, . . . , and Rq.

Also, at the time t5, the high-level signal applied to the carry clock line CRCK5 may be maintained, and the output of the high-level signal to the carry line CR(2n−1) may be maintained. The high-level signal output to the carry line CR(2n−1) may primarily charge the fifty-second transistor connected to an input terminal of a next stage (e.g., ST(2n+

1) or ST(2n+2)). The carry clock line CRCK5 may be maintained at the high level during a period t5 to t8. The high-level signal output to the carry line CR(2n−1) may be maintained during the period t5 to t8.

In the other first stages except the first stage ST(2n−1), since the voltage of the third node N3 has the low level, a low-level signal may be output to corresponding scan lines and corresponding sensing lines in spite of the high-level pulses applied to the scan clock line SCCK5 and the sensing clock line SSCK5.

Since the fifty-second transistor of the second stage ST2n is connected to the same carry line CR(2n−3) as the first stage ST(2n−1), the sixth capacitor C6 may be in a state in which the same voltage as the fifth capacitor C5 is charged in the sixth capacitor C6. However, a low-level voltage is maintained in the scan clock line SCCK6 and the sensing clock line SSCK6, which are connected to the second stage ST2n, during the sensing period, so that the voltage of the scan line SC(2n+1) and the sensing line SS(2n+1) may maintain the low level.

At a time t6, a high-level signal may be applied to the scan clock line SCCK5 and the sensing clock line SSCK5. Just previous data voltages may be again applied to the data lines. Therefore, pixels connected to the scan line SC(2n−1) and the sensing line SS(2n−1) may again emit lights with grayscales based on the just previous data voltages.

In accordance with this exemplary embodiment, the pixels connected to the scan line SC(2n−1) and the sensing line SS(2n−1) do not emit lights with the grayscales based on the data voltages during a period t5 to t6, but may again emit lights with the grayscales based on the data voltages after the time t6. In addition, pixels connected to other scan lines and other sensing lines continuously emit lights with the grayscales based on the data voltages during the sensing period, and thus there is no problem when a viewer recognizes a frame.

At a time t7, a low-level signal may be applied to the scan clock line SCCK5 and the sensing clock line SSCK5. A period t7 to t8 may be a delay period until a sensing period of stages disposed adjacent to each other is started after the time t7. That is, the sensing period may include a delay period (e.g., the period t7 to t8) until the sensing period of stages disposed adjacent to each other is started, after a process of inputting a black data voltage to each pixel, initializing the pixel, sensing the pixel, and then again inputting a black data voltage to the pixel during a period t5 to t7 is performed. In an exemplary embodiment, the stage ST(2n−1) and the stage ST2n correspond to stages disposed adjacent to each other, and the stage ST2n and the stage ST(2n+1) correspond to stages disposed adjacent to each other, for example.

In an exemplary embodiment, the period t7 to t8 is the delay period, and may have a length of six horizontal periods or more, for example. In an exemplary embodiment, the period t7 to t8 may be about 20 µs or more, for example.

In an exemplary embodiment, a high-level signal may be applied to the scan clock line SCCK5 and the sensing clock line SSCK5 just before the period t7 to t8 is ended. In an exemplary embodiment, the period in which the high-level signal is be applied to the scan clock line SCCK5 and the sensing clock line SSCK5 just before the period t7 to t8 is ended may be six horizontal periods or equal to or less than about 20 µs or less, for example.

Therefore, a high-level signal may be output to the scan line SC(2n−1) and the sensing line SS(2n−1). The period in which the high-level signal is output to the scan line SC(2n−1) and the sensing line SS(2n−1), corresponding to the period in which high-level signal is applied to the scan clock line SCCK5 and the sensing clock line SSCK5, may be equal to or less than six horizontal periods or equal to or less than about 20 µs or less, for example.

Since the output of the high-level signal to the carry line CR(2n−1) is maintained, the high-level signal output to the carry line CR(2n−1) may secondarily charge the fifty-second transistor connected to the input terminal of the next stage (e.g., ST(2n+1) or ST(2n+2)).

Although the scan driver 13 is disposed (e.g., mounted) as the OSG driver circuit, a high-level signal is output to the scan line SC(2n−1) and the sensing line SS(2n−1) while a high-level signal is being output to the carry line CR(2n−1) at least once during a delay period. Thus, a next stage may be normally driven. Accordingly, sensing reliability may be improved.

In an exemplary embodiment, a time t8 at which a high-level signal output to the scan line SC(2n−1) and the sensing line SS(2n−1) is changed to a low-level signal may be identical to a time at which a low-level signal output to the scan line SC(2n+1) and the sensing line SS(2n+1) is changed to a high-level signal.

FIG. 9 is a schematic cross-sectional view illustrating an exemplary embodiment of a pixel unit in accordance with the invention. In this exemplary embodiment, a pixel unit in which an organic light emitting diode is applied to the above-described light emitting device LD is described as an example.

Referring to FIG. 9, the pixel unit 15 may include a display substrate 101, a plurality of transistors TR1, TR2, and TR3 disposed on the display substrate 101, a plurality of organic light emitting diodes 310 disposed on the plurality of transistors TR1, TR2, and TR3, and a first encapsulation layer 400 disposed on the plurality of organic light emitting diodes 310.

The display substrate 101 may be a rigid substrate or a flexible substrate. When the display substrate 101 is the rigid substrate, the display substrate 101 may be one of a glass substrate, a quartz substrate, a glass ceramic substrate, and a crystalline glass substrate. When the display substrate 101 is the flexible substrate, the display substrate 101 may be one of a film substrate and a plastic substrate, which include a polymer organic material. Also, the display substrate 101 may include a fiber glass reinforced plastic ("FRP"). The display substrate 101 may be a lower substrate of the pixel unit 15. In an exemplary embodiment, the display substrate 101 may be an opaque substrate.

A first buffer layer 201 is disposed on the display substrate 101. The first buffer layer 201 planarizes a surface of the display substrate 101, and prevents penetration of moisture or external air. The first buffer layer 201 may be an inorganic layer. The first buffer layer 201 may be a single layer or a multi-layer.

The plurality of transistors TR1, TR2, and TR3 are disposed on the first buffer layer 201. Each of the transistors TR1, TR2, and TR3 may be a thin film transistor. Each of the transistors TR1, TR2, and TR3 shown in the drawing may be a driving transistor (e.g., M1 shown in FIG. 6) among thin film transistors.

The transistors TR1, TR2, and TR3 may include a first transistor TR1, a second transistor TR2, and a third transistor TR3. One or more of the transistors TR1, TR2, and TR3 may be provided for each pixel. In an exemplary embodiment, the first transistor TR1 may be provided in a red pixel, the second transistor TR2 may be provided in a green pixel, and the third transistor TR3 may be provided in a blue pixel, for example.

The transistors TR1, TR2, and TR3 may include semiconductor layers A1, A2, and A3, gate electrodes G1, G2, and G3, source electrodes S1, S2, and S3, and drain electrodes D1, D2, D3, respectively. Specifically, the semiconductor layers A1, A2, and A3 are disposed on the first buffer layer 201. The semiconductor layers A1, A2, and A3 may include amorphous silicon, poly-silicon, low temperature poly-silicon, and an organic semiconductor. In another exemplary embodiment, each of the semiconductor layers A1, A2, and A3 may be an oxide semiconductor. Although not clearly shown in the drawing, each of the semiconductor layers A1, A2, and A3 may include a channel region, and a source region and a drain region, which are disposed at both sides of the channel region and are doped with an impurity.

A gate insulating layer 211 is disposed over the semiconductor layers A1, A2, and A3. The gate insulating layer 211 may be an inorganic layer. The gate insulating layer 211 may be a single layer or a multi-layer.

The gate electrodes G1, G2, and G3 are disposed on the gate insulating layer 211. The gate electrodes G1, G2, and G3 may include a metallic material having conductivity. In an exemplary embodiment, the gate electrodes G1, G2, and G3 may include molybdenum (Mo), aluminum (Al), copper (Cu), and titanium (Ti), for example. Each of the gate electrodes G1, G2, and G3 may be a single layer or a multi-layer.

An inter-insulating layer 212 is disposed over the gate electrodes G1, G2, and G3. The inter-insulating layer 212 may be an inorganic layer. The inter-insulating layer 212 may be a single layer or a multi-layer.

The source electrodes S1, S2, and S3 and the drain electrodes D1, D2, and D3 are disposed on the inter-insulating layer 212. The source electrodes S1, S2, and S3 and the drain electrodes D1, D2, and D3 include a metallic material having conductivity. In an exemplary embodiment, the source electrodes S1, S2, and S3 and the drain electrodes D1, D2, and D3 may include aluminum (Al), copper (Cu), titanium (Ti), and molybdenum (Mo), for example.

The source electrodes S1, S2, and S3 and the drain electrodes D1, D2, and D3 may be electrically connected to the source regions and the drain regions of the semiconductor layers A1, A2, and A3 through contact holes penetrating the inter-insulating layer 212 and the gate insulating layer 211, respectively.

Although not separately shown in the drawing, the display device 10 may further include a storage capacitor and a switch transistor on the display substrate 101.

A protective layer 220 is disposed on the source electrodes S1, S2, and S3, the drain electrodes D1, D2, and D3, and the inter-insulating layer 212. The protective layer 220 covers a circuit including the transistors TR1, TR2, and TR3. The protective layer 220 may be a passivation layer or a planarization layer. The passivation layer may include $SiO_2$, SiNx, etc., and the planarization layer may include a material such as acryl or polyimide. The protective layer 220 may include both the passivation layer and the planarization layer. The passivation layer may be disposed on the source electrodes S1, S2, and S3, the drain electrodes D1, D2, and D3, and the inter-insulating layer 212, and the planarization layer may be disposed on the passivation layer. An upper surface of the protective layer 220 may be planarized.

The plurality of organic light emitting diodes 310 may be disposed on the protective layer 220. As described above, the organic light emitting diodes 310 may be disposed in the respective pixels.

A plurality of first pixel electrodes 311 is disposed on the protective layer 220. The first pixel electrodes 311 may be pixel electrodes disposed in the respective pixels. Also, each of the plurality of first pixel electrodes 311 may be an anode of the organic light emitting diode 310.

The first pixel electrodes 311 may be electrically connected to the drain electrodes D1, D2, and D3 (or the source electrode S1, S2, and S3) disposed on the display substrate 101 through via holes penetrating the protective layer 220, respectively.

The plurality of first pixel electrodes 311 may include a material having a high work function. The plurality of first pixel electrodes 311 may include indium tin oxide ("ITO"), indium zinc oxide ("IZO"), zinc oxide (ZnO), indium oxide ($In_2O_3$), and the like.

In an exemplary embodiment, in each pixel, areas occupied by the first pixel electrodes 311 in a plan view may be the same, but the invention is not limited thereto.

A pixel defining layer 330 is disposed on the plurality of first pixel electrodes 311. An opening exposing at least a portion of each of the first pixel electrodes 311 may be defined in the pixel defining layer 330. In an exemplary embodiment, in each pixel, the openings may have different widths. In an exemplary embodiment, widths of the opening of the red pixel, the opening of the green pixel, and the opening of the blue pixel may be sequentially narrowed, for example.

The pixel defining layer 330 may include an organic material or an inorganic material. In an exemplary embodiment, the pixel defining layer 330 may include materials such as photoresist, polyimide-based resin, acrylic-based resin, silicon compound, and polyacrylic-based resin.

An organic light emitting layer 320 may be disposed on each of the first pixel electrodes 311 exposed by the pixel defining layer 330. In an exemplary embodiment, the organic light emitting layer 320 may be provided in a form in which a first hole transport layer (not shown), a light emitting layer (not shown), and a first electron transport layer (not shown) are sequentially disposed, for example. In an exemplary embodiment, the organic light emitting layers 320 of each pixel are all organic light emitting layers 320 of blue, but the invention is not limited thereto.

A second pixel electrode 312 is disposed on the organic light emitting layer 320. The second pixel electrode 312 may be a common electrode disposed throughout the entire display substrate 101 without distinguishing the pixels. Also, the second pixel electrode 312 may be a cathode of the organic light emitting diode 310.

The second pixel electrode 312 may include a material having a low work function. In an exemplary embodiment, the second pixel electrode 312 may include Li, Ca, LiF/Ca, LiF/Al, Al, Mg, Ag, Pt, Pd, Ni, Au, Nd, Ir, Cr, BaF, Ba, or a compound or combination thereof (e.g., a combination of Ag and Mg), for example. The second pixel electrode 312 may further include an auxiliary electrode. In an exemplary embodiment, the auxiliary electrode may include a layer provided by depositing the material, and a transparent metal oxide on the layer, e.g., ITO, IZO, Zinc Oxide (ZnO), indium tin zinc oxide ("ITZO"), etc.

In an exemplary embodiment, when the display device 10 is a top emission type display device, a conductive layer having a low work function as the second pixel electrode 312 may be provided as a thin film, and a transparent conductive layer, e.g., an ITO layer, an IZO layer, a zinc oxide (ZnO) layer, an indium oxide ($In_2O_3$) layer, or the like may be stacked on the top of the conductive layer.

In each pixel, the first pixel electrode 311, the organic light emitting layer 320, and the second pixel electrode 312, which are described above, may constitute one organic light emitting diode 310.

The element kind and the stacking order of the organic light emitting diode 310 are not limited to those shown in the drawing.

The first encapsulation layer 400 includes an inorganic layer and/or an organic layer. The first encapsulation layer 400 may include a plurality of stacked layers. The first encapsulation layer 400 may be provided in a multi-layer including a first inorganic layer 410, an organic layer 420, and a second inorganic layer 430, which are sequentially stacked on the second pixel electrode 312.

In an exemplary embodiment, the first inorganic layer 410 and the second inorganic layer 430 may include at least one of silicon oxide (SiOx), silicon nitride (SiNx), and silicon oxynitride (SiONx), for example.

In an exemplary embodiment, the organic layer 420 may include at least one of epoxy, acrylate, and urethane acrylate, for example.

The display device 10 may include a second buffer layer 501, a black matrix 521, a first color conversion filter, a first capping layer 511, a second color conversion filter, a second capping layer 512, an overcoat layer 513, a passivation layer 514, and a cover layer 550, which are sequentially stacked on the first encapsulation layer 400. The display device 10 may include a second buffer layer 501, a passivation layer 514, an overcoat layer 513, a second capping layer 512, a second color conversion filter, a first capping layer 511, a first color conversion filter, and a black matrix 521, which are sequentially stacked on the first encapsulation layer 400.

The second buffer layer 501 is disposed on the first encapsulation layer 400. The second buffer layer 501 planarizes a surface of the first encapsulation layer 400, and prevents penetration of moisture or external air into the first encapsulation layer 400. The second buffer layer 501 may be an inorganic layer. The second buffer layer 501 may be a single layer or a multi-layer. In another exemplary embodiment, the second buffer layer 501 may be omitted.

In another exemplary embodiment, a separate filling material may be disposed between the first encapsulation layer 400 and the second buffer layer 501. In still another exemplary embodiment, an upper surface of the first encapsulation layer 400 and a lower surface of the first color conversion filter which will be described later may be in direct contact with each other.

The black matrix 521 is disposed on an upper substrate 560. The black matrix 521 may be disposed along a boundary of the pixels, and block transmission of light. The black matrix 521 may overlap with the pixel defining layer 330. An opening in which each pixel may be defined may be defined in the black matrix 521.

The material of the black matrix 521 is not particularly limited as long as the material may block light. In an exemplary embodiment, the black matrix 521 may include a photosensitive composition, an organic material, a metallic material, or the like. In an exemplary embodiment, the photosensitive composition may include a binder resin, a polymeric monomer, a polymeric oligomer, a pigment, a dispersant, etc. The metallic material may include chromium, etc.

The first color conversion filter is disposed on the upper substrate 560 and the black matrix 521. The first color conversion filter may overlap with the opening of the black matrix 521.

In an exemplary embodiment, the first color conversion filter may be a color filter 540. The color filter 540 allows light of a specific color to be selectively transmitted therethrough, and may block advancing of light of another color by absorbing the light. The light passing through the color filter 540 may display one of primary colors of red, green, and blue. However, the color displayed by the light passing through the color filter 540 is not limited to the primary colors, and the light may display any one of colors of cyan, magenta, yellow, and white.

In this exemplary embodiment, a case where the first color conversion filter includes a first color filter 541 of red, a second color filter 542 of green, and a third color filter 543 of blue is described as an example.

The first color filter 541 may be disposed in the red pixel. The first color filter 541 allows light of a first color to be transmitted therethrough, and may absorb and block light of a second color and light of a third color. The first color may be red, the second color may be green, and the third color may be blue. That is, the first color filter 541 may be a red color filter, and include a red colorant. The red color filter allows red light to be transmitted therethrough, and may absorb and block green light and blue light.

The second color filter 542 may be disposed in the green pixel. The second color filter 542 allows light of the second color to be transmitted therethrough, and may absorb and block light of the first color and light of the third color. That is, the second color filter 542 may be a green color filter, and include a green colorant. The green color filter allows green light to be transmitted therethrough, and may absorb and block red light and blue light.

The third color filter 543 may be disposed in the blue pixel. The third color filter 543 allows light of the third color to be transmitted therethrough, and may absorb and block light of the first color and light of the second color. That is, the third color filter 543 may be a blue color filter, and include a blue colorant. The blue color filter allows blue light to be transmitted therethrough, and may absorb and block red light and green light.

Since the color filter absorbs external light to a considerable degree, the color filter may decrease reflection of the external light even when a polarizing plate or the like is additionally disposed.

In an exemplary embodiment, a boundary portion between color filters may be disposed in a non-emission region. That is, the boundary portion between the color filters may overlap with the black matrix 521.

The first capping layer 511 is disposed over the first color conversion filter. The first capping layer 511 prevents the first color conversion filter or the like from being damaged due to penetration of moisture, air or the like from the outside. Also, the first capping layer 511 prevents a colorant included in each color filter from being diffused into another component.

In some exemplary embodiments, the first capping layer 511 may include an inorganic material. In an exemplary embodiment, the first capping layer 511 may include at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and the like, for example.

The second color conversion filter and a light transmission pattern 533 are disposed on the first capping layer 511. In an exemplary embodiment, the thickness of second color conversion filter and the light transmission pattern 533 is about 2 μs to about 20 μs, for example.

The second color conversion filter may be a wavelength conversion pattern 530. The wavelength conversion pattern 530 may convert incident light with a peak wavelength into light with a specific peak wavelength and emit the converted light. The light passing through the wavelength conversion pattern 530 may display one of three primary colors such as red, green, and blue. However, the color displayed by the light passing through the wavelength conversion pattern 530 is not limited to the primary colors, and the light passing through the wavelength conversion pattern 530 may display any one of cyan, magenta, yellow, and white series colors.

In this exemplary embodiment, a case where the wavelength conversion pattern 530 includes a first wavelength conversion pattern 531 and a second wavelength conversion pattern 532, which are different from each other, is described as an example.

The first wavelength conversion pattern 531 may be disposed in the red pixel. In an exemplary embodiment, the first wavelength conversion pattern 531 may convert blue light into red light with a wavelength in a range of about 610 nanometers (nm) to about 650 nm, and emit the red light, for example. The first wavelength conversion pattern 531 may not be disposed in the green pixel and the blue pixel.

The first wavelength conversion pattern 531 may include a first base resin 5311 and a first wavelength conversion material 5313 dispersed in the first base resin 5311, and further include a first scattering material 5315 dispersed in the first base resin 5311.

The first base resin 5311 is not particularly limited as long as it is a material which has high light transmittance and has excellent dispersion characteristic with respect to the first wavelength conversion material 5313 and the first scattering material 5315. In an exemplary embodiment, the first base resin 5311 may include an organic material such as epoxy-based resin, acryl-based resin, cardo-based resin, or imide-based resin, for example.

The first wavelength conversion material 5313 may convert incident light with a peak wavelength into light with a specific peak wavelength. Examples of the first wavelength conversion material 5313 may be a QD, a quantum rod, a fluorescent substance, and the like.

The QDs may be semiconductor nanocrystalline materials. The QDs have a specific band gap depending on their composition and size, and may emit light having an inherent band after absorbing light. Examples of the semiconductor nanocrystals of the QDs may include a Group IV based nanocrystal, a Group II-VI based compound nanocrystal, a Group III-V based compound nanocrystal, a Group IV-VI based nanocrystal, or a combination thereof.

In an exemplary embodiment, the group IV based nanocrystal may include a dyadic compound such as silicon (Si), germanium (Ge), silicon carbide (SiC), and silicon-germanium (SiGe), for example. However, the invention is not limited thereto.

Further, the group II-VI compound nanocrystals may include dyadic compounds, such as CdSe, CdTe, ZnS, ZnSe, ZnTe, ZnO, HgS, HgSe, HgTe, MgSe, MgS, combinations thereof, and/or the like, triad compounds, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, combinations thereof, and/or the like, and tetrad compounds, such as HgZnTeS, CdZnSeS, CdZnSeTe, CdZnSTe, CdHgSeS, CdHgSeTe, CdHgSTe, HgZnSeS, HgZnSeTe, HgZnSTe, combinations thereof, and/or the like. However, the invention is not limited thereto.

In addition, the group III-V compound nanocrystals may include dyadic compounds, such as GaN, GaP, GaAs, GaSb, AlN, AlP, AlAs, AlSb, InN, InP, InAs, InSb, combinations thereof, and/or the like, triad compounds, such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, combinations thereof, and/or the like, or tetrad compounds, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, combinations thereof, and/or the like. However, the invention is not limited thereto.

The group IV-VI nanocrystals may include dyadic compounds, such as SnS, SnSe, SnTe, PbS, PbSe, PbTe, combinations thereof, and/or the like, triad compounds, such as SnSeS, SnSeTe, SnSTe, PbSeS, PbSeTe, PbSTe, SnPbS, SnPbSe, SnPbTe, combinations thereof, and/or the like, or tetrad compounds, such as SnPbSSe, SnPbSeTe, SnPbSTe, combinations thereof, and/or the like. However, the invention is not limited thereto.

The QDs may have a core-shell structure, which includes a core including the above-described nanocrystals and a shell surrounding the core. The shell of the QDs may serve as a protective layer for preventing or reducing the chemical denaturation of the core to maintain semiconductor characteristics and/or a charging layer for imparting electrophoretic characteristics to the QDs. The shell may be a single layer or a multi-layer structure. As an example, a metal or non-metal oxide, a semiconductor compound, a combination thereof, and/or the like may be adopted as the shell of the QDs.

In an exemplary embodiment, the above-described metal or nonmetal oxide may include a dyadic compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like, or triad compounds, such as $MgAl_2O_4$, $CoFe_2O_4$, $NiFe_2O_4$, $CoMn_2O_4$, and/or the like. However, the invention is not limited thereto.

Further, in an exemplary embodiment, the above-described semiconductor compound may include at least one of CdS, CdSe, CdTe, ZnS, ZnSe, ZnTe, GaAs, GaP, GaSb, HgS, HgSe, HgTe, InAs, InP, InSb, AlAs, AlP, AlSb, and/or the like, for example. However, the invention is not limited thereto.

In an exemplary embodiment, the light emitted by the first wavelength conversion material 5313 may have a full width of half maximum ("FWHM") of the light-emitting wavelength spectrum of about 45 nm or less, about 40 nm or less, or about 30 nm or less, for example, thereby further improving the color purity and the color reproducibility. Further, the light emitted by the first wavelength conversion material 5313 may be emitted in various directions regardless of the incident angle of the incident light. Accordingly, the side visibility of the display device may be improved.

A portion of light L emitted from the organic light emitting diode 310 is not converted into red light by the first wavelength conversion material 5313 but may be emitted by passing through the first wavelength conversion pattern 531. A component which is not converted by the first wavelength conversion pattern 531 but is incident into the first color filter 541 may be blocked by the first color filter 541. Red light converted by the first wavelength conversion pattern 531 may be emitted to the outside by passing through the first color filter 541. Accordingly, first emission light L1 emitted to the outside in the red pixel may be red light.

The first scattering material 5315 may have a refractive index different from that of the first base resin 5311, and form an optical interface with the first base resin 5311. In an exemplary embodiment, the first scattering material 5315 may be a light scattering particle, for example. The first scattering material 5315 is not particularly limited as it includes a material capable of scattering at least some of transmitted lights. In an exemplary embodiment, the first scattering material 5315 may include a metal oxide particle or organic particle, for example. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of the organic material may include acryl-based resin, urethane-based resin, and the like. The first scattering material 5315 may scatter light in several directions irrespective of the incident direction of incident light, without substantially converting the wavelength of the light transmitted through the first wavelength conversion pattern 531. Accordingly, the path length of light transmitted through the first wavelength conversion pattern 531 may be increased, and the color conversion efficiency caused by the first wavelength conversion material 5313 may be improved.

In some exemplary embodiments, the first wavelength conversion pattern 531 may have a thickness of 3 micrometers (μm) to 15 μm. The first wavelength conversion material 5313 included in the first wavelength conversion pattern 531 may have a content of 10 percent (%) to 60%, for example. In addition, the first scattering material 5315 included in the first wavelength conversion pattern 531 may have a content of 2% to 15%.

The second wavelength conversion pattern 532 may be disposed in the green pixel. In an exemplary embodiment, the second wavelength conversion pattern 532 may convert blue light into green light with a wavelength in a range of about 510 nm to about 550 nm, and emit the green light. The second wavelength conversion pattern 532 may not be disposed in the red pixel and the green pixel.

The second wavelength conversion pattern 532 may include a second base resin 5321 and a second wavelength conversion material 5323 dispersed in the second base resin 5321, and further include a second scattering material 5325 dispersed in the second base resin 5321.

The second base resin 5321 is not particularly limited as long as it is a material which has high light transmittance and has excellent dispersion characteristic with respect to the second wavelength conversion material 5323 and the second scattering material 5325. In an exemplary embodiment, the second base resin 5321 may include an organic material such as epoxy-based resin, acryl-based resin, cardo-based resin, or imide-based resin.

Examples of the second wavelength conversion material 5323 may be a QD, a quantum rod, a fluorescent substance, and the like. In addition, a detailed description of the second wavelength conversion material 5323 is substantially identical or similar to that of the first wavelength conversion material 5313, and therefore, overlapping descriptions will be omitted.

Both the first wavelength conversion material 5313 and the second wavelength conversion material 5323 may be configured with QDs. The QD constituting the first wavelength conversion material 5313 may have a diameter greater than that of the QD constituting the second wavelength conversion material 5323. In an exemplary embodiment, the QD of the first wavelength conversion material 5313 may have a size of about 55 angstroms (Å) to about 65 Å, for example. In addition, in an exemplary embodiment, the QD of the second wavelength conversion material 5323 may have a size of about 40 Å to about 50 Å, for example.

Light transmitted through the first wavelength conversion pattern 531 and the second wavelength conversion pattern 532 may be in an unpolarized state in which polarization is resolved. Unpolarized light means light which is not configured with only a polarization component in a specific direction, i.e., light which is not polarized in only the specific direction, i.e., light configured with a random polarization component. An example of the unpolarized light may be natural light.

The second scattering material 5325 may have a refractive index different from that of the second base resin 5321, and form an optical interface with the second base resin 5321. In addition, a detailed description of the second scattering material 5325 is substantially identical or similar to that of the first scattering material 5315, and therefore, overlapping descriptions will be omitted.

The second wavelength conversion material 5323 included in the second wavelength conversion pattern 532 may have a content of 10% to 60%. In addition, in an exemplary embodiment, the second scattering material 5325 included in the second wavelength conversion pattern 532 may have a content of 2% to 15%, for example.

A portion of light L emitted from the organic light emitting diode 310 is not converted into green light by the second wavelength conversion material 5323 but may be emitted by passing through the second wavelength conversion pattern 532. A component which is not converted by the second wavelength conversion pattern 532 but is incident into the second color filter 542 may be blocked by the second color filter 542. Green light converted by the second wavelength conversion pattern 532 in the light L may be emitted to the outside by passing through the second color filter 542. Accordingly, second emission light L2 emitted to the outside in the green pixel may be green light.

The light transmission pattern 533 is disposed in the blue pixel, and may not be disposed in the red pixel and the green pixel. The light transmission pattern 533 may allow incident light to be roughly transmitted therethrough.

The light transmission pattern 533 may further include a third base resin 5331 and a third scattering material 5335 dispersed in the third base resin 5331.

The third base resin 5331 may include an organic material having a high light transmittance. The third base resin 5331 may include the same material as that of the first base resin 5311 or include at least one of the materials exemplified as the material constituting the first base resin 5311.

The third scattering material 5335 may have a refractive index different from that of the third base resin 5331, and form an optical interface with the third base resin 5331. In an exemplary embodiment, the third scattering material 5335 may be a light scattering particle, for example. The third scattering material 5335 is not particularly limited as it includes a material capable of scattering at least some of transmitted lights. In an exemplary embodiment, the third scattering material 5335 may be a metal oxide particle or organic particle, for example. Examples of the metal oxide may be titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of the organic material may be acryl-based resin, urethane-based resin, and the like. The third scattering material 5335 may scatter light in several directions irrespective of the incident direction of incident light, without substantially converting the wavelength of the light transmitted through the light transmission pattern 533. Accordingly, the lateral visibility of light transmitted through the light transmission pattern 533 may be improved.

Light L emitted from the organic light emitting diode 310 is emitted to the outside by passing through the light transmission pattern 533 and the third color filter 543. That is, third emission light L3 emitted from the blue pixel may have the same wavelength as the light L as blue light emitted from the organic light emitting diode 310.

The first wavelength conversion pattern 531, the second wavelength conversion pattern 532, and the light transmission pattern 533 may be spaced apart from each other in a plan view. Therefore, materials respectively included in the first wavelength conversion pattern 531, the second wavelength conversion pattern 532, and the light transmission pattern 533 may not be mixed together. A separation space may be defined between the first wavelength conversion pattern 531, the second wavelength conversion pattern 532, and the light transmission pattern 533, which are spaced apart from each other.

The second capping layer 512 may be disposed over the first wavelength conversion pattern 531, the second wavelength conversion pattern 532, and the light transmission pattern 533. The second capping layer 512 may cover the first wavelength conversion pattern 531, the second wavelength conversion pattern 532, and the light transmission pattern 533. The second capping layer 512 may be disposed in a separation space between the first wavelength conversion pattern 531, the second wavelength conversion pattern 532, and the light transmission pattern 533. In the separation space, the second capping layer 512 may be in direct contact with the first capping layer 511.

The second capping layer 512 along with the first capping layer 511 may seal the first wavelength conversion pattern 531, the second wavelength conversion pattern 532, and the light transmission pattern 533, and accordingly, the first wavelength conversion pattern 531, the second wavelength conversion pattern 532, and the light transmission pattern 533 may be prevented from being damaged or contaminated due to penetration of an impurity such as moisture or air from the outside. The second capping layer 512 may correspond to a roof layer which will be described later.

The second capping layer 512 may include an inorganic material. The second capping layer 512 may include the same material as that of the first capping layer 511, or include at least one of the materials mentioned in the description of the first capping layer 511.

In an exemplary embodiment, the second capping layer 512 may have a thickness of about 1000 Å to about 20000 Å, for example. In some exemplary embodiments, the second capping layer 512 may have a thickness of about 4000 Å, for example. The second capping layer 512 may be provided in a single layer, but the invention is not limited thereto.

The overcoat layer 513 is disposed on the second capping layer 512. The overcoat layer 513 may function to protect the plurality of wavelength conversion patterns and the light transmission pattern while planarizing the second capping layer 512. In general, an acrylic-based epoxy material is used for the overcoat layer 513, but the invention is not limited thereto.

The passivation layer 514 is disposed on the overcoat layer 513. An emission region may be covered by the passivation layer 514. In an exemplary embodiment, the passivation layer 514 may include an inorganic insulating material, e.g., silicon oxide (SiOx), silicon nitride (SiNx), silicon oxynitride (SiON), etc.

In an exemplary embodiment, an upper substrate 560 may be disposed on the passivation layer 514. The upper substrate 560 may include a material having light transmissivity.

The upper substrate 560 may be a rigid substrate or a flexible substrate. In an exemplary embodiment, the upper substrate 560 may be a window member or an encapsulating substrate.

When the upper substrate 560 is the rigid substrate, the upper substrate 560 may be one of a glass substrate, a quartz substrate, a glass ceramic substrate, and a crystalline glass substrate. When the upper substrate 560 is the flexible substrate, the upper substrate 560 may be one of a film substrate and a plastic substrate, which include a polymer organic material. Also, the upper substrate 560 may include an FRP.

Next, a display device in another exemplary embodiment of the invention will be described. Hereinafter, components identical to those shown in FIGS. 1 to 9 are designated by like reference numerals, and their overlapping descriptions will be omitted.

Figure 10:
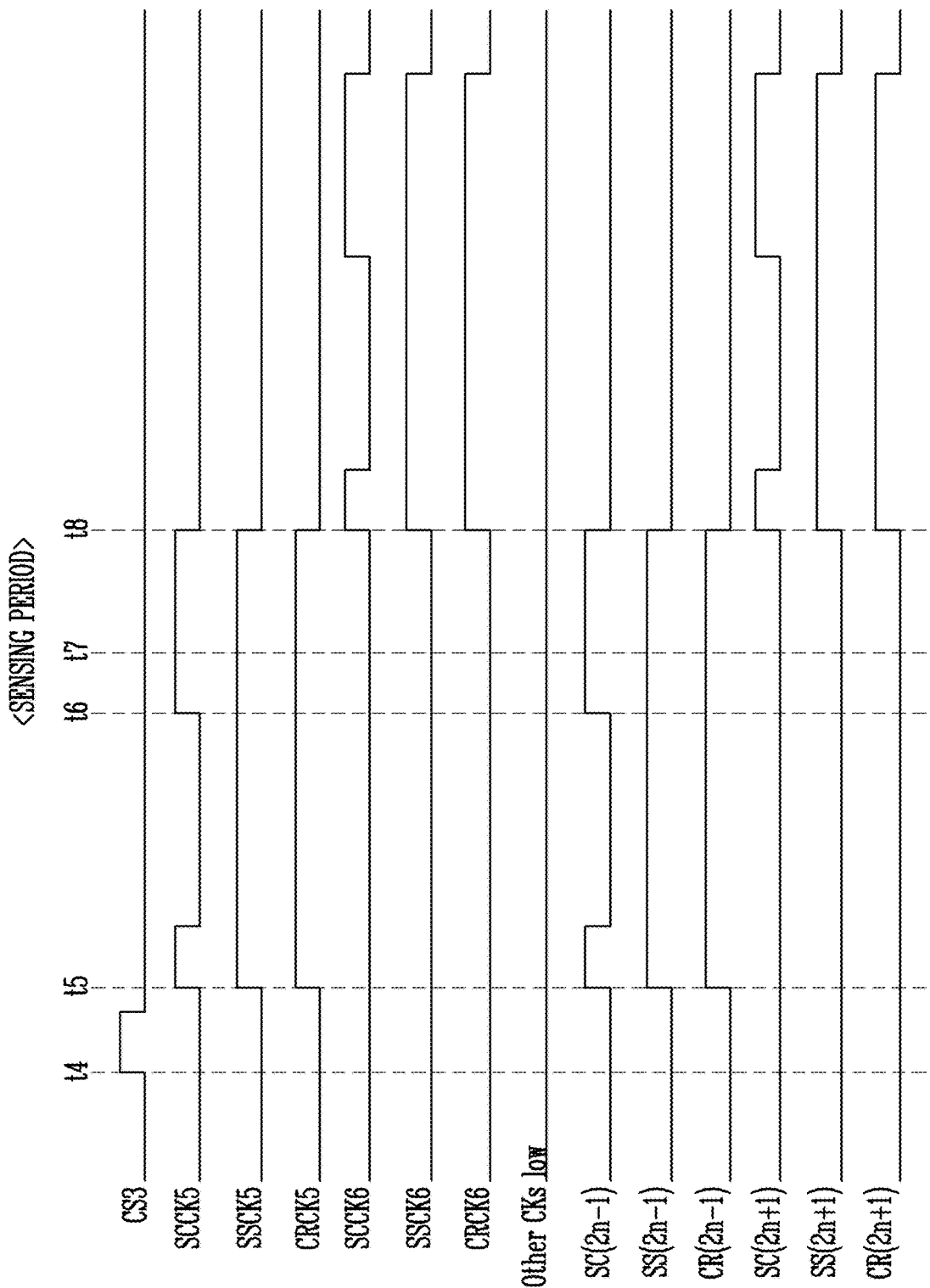
FIG. 10 is a timing diagram illustrating another exemplary embodiment of a driving method of the scan driver in a sensing period of a display device in accordance with the invention.

FIG. 10 is a timing diagram illustrating an exemplary driving method of the scan driver in a sensing period of a display device in another exemplary embodiment of the invention.

Referring to FIG. 10, in a period t6 to t8, a high-level signal may be maintained in the scan clock line SCCK5 and the sensing clock line SSCK5. Therefore, in the period t6 to t8, the output of the high-level signal to the scan line SC(2$n$–1) and the sensing line SS(2$n$–1) may be maintained. That is, a period in which the high-level signal is maintained in the scan clock line SCCK5, the sensing clock line SSCK5, the scan line SC(2$n$–1), and the sensing line SS(2$n$–1) may be equal to or greater than six horizontal periods or equal to or greater than about 20 μs, for example.

In an exemplary embodiment, a period in which the output of the high-level signal to the carry line CR(2$n$–1) and the sensing line SS(2$n$–1) is maintained may be no less than that in which the output of the high-level signal to the scan line SC(2$n$–1) is maintained. Times at which output signals of the carry line CR(2$n$–1) and the sensing line SS(2$n$–1) are changed from a high level to a low level in the sensing period may be the same. That is, the high-level signal may be equally output to the carry line CR(2$n$-1) and the sensing line SS(2$n$–1) in the sensing period.

Since the output of the high-level signal to the carry line CR(2$n$–1) is maintained, the high-level signal output to the carry line CR(2$n$–1) may charge the fifty-second transistor connected to the input terminal of the next stage (e.g., ST(2$n$+1) or ST(2$n$+2)).

Figure 11:
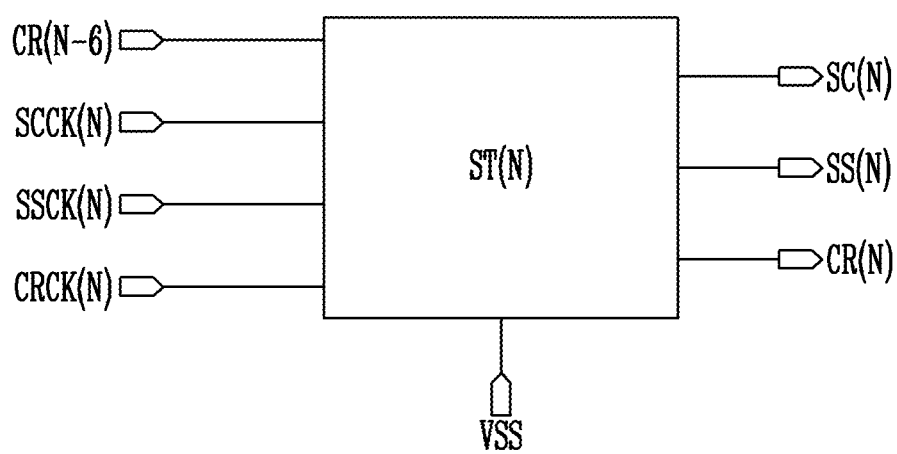
FIG. 11 is a diagram schematically illustrating another exemplary embodiment of terminals connected to one stage of a display device in accordance with the invention.

FIG. 11 is a diagram schematically illustrating another exemplary embodiment of terminals connected to one stage of a display device in accordance with the invention.

Referring to FIG. 11, an Nth stage ST(N) in accordance with this exemplary embodiment is different from the above-described embodiments, in that the Nth stage ST(N) is connected to a carry line CR(N–6) of an (N–6)th stage.

In an exemplary embodiment, a carry signal of the (N–6) th stage may be transferred to an Nth stage ST(N) as a next stage.

This exemplary embodiment is different from the exemplary embodiment shown in FIGS. 1 to 9 in an order in which a carry signal of each stage is transferred, and the exemplary embodiment shown in FIGS. 5, 6, and 8 may be applied to driving methods in a sensing period and a display period for each stage. Therefore, overlapping descriptions will be omitted.

In the scan driver and the display device including the same in accordance with the invention, electric discharge does not occur during the sensing period, so that sensing sensitivity may be increased.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention.

What is claimed is:

1. A display device driven for at least one frame including a display period and a sensing period, the display device comprising:
    a pixel unit including a plurality of pixels; and
    a scan driver including a plurality of stages each connected to each of the plurality of pixels, a scan line, and a sensing line, the scan driver comprising:
        a first stage including a first output terminal connected to a first carry line, a second output terminal connected to a first scan line, and a third output terminal connected to a first sensing line; and
        a second stage including a first input terminal connected to the first carry line, a fourth output terminal connected to a second scan line, and a fifth output terminal connected to a second sensing line,
    wherein, in the sensing period, signals having a turn-on level are respectively output from the first output terminal, the second output terminal, and the third output terminal during a predetermined delay period before signals having a turn-on level are respectively output from the fourth output terminal and the fifth output terminal.

2. The display device of claim 1, wherein the display period is a period for reproducing an input image on a screen by supplying a data voltage to each of the plurality of pixels, and
    the sensing period is a period for performing a process of inputting a black data voltage to each of the plurality of pixels, initializing the plurality of pixels, sensing the plurality of pixels, and then again inputting a black data voltage to the plurality of pixels.

3. The display device of claim 2, wherein the predetermined delay period is a period until a sensing period of stages disposed adjacent to each other is started after the process of again inputting the black data voltage, and is equal to or greater than six horizontal periods,
    wherein one horizontal period is defined by one frame of the at least one frame.

4. The display device of claim 1, wherein, in the sensing period, a time at which the signals having the turn-on level are respectively output from the first output terminal, the second output terminal, and the third output terminal is before 20 microseconds from a time at which the signals having the turn-on level are respectively output from the fourth output terminal and the fifth output terminal.

5. The display device of claim 1, wherein the second output terminal outputs the signal having the turn-on level in response to a signal provided from a first scan clock line connected to an input terminal of the first stage,
    the third output terminal outputs the signal having the turn-on level in response to a signal provided from a first sensing clock line connected to an input terminal of the first stage,
    the fourth output terminal outputs the signal having the turn-on level in response to a signal provided from a second scan clock line connected to an input terminal of the second stage, and
    the fifth output terminal outputs the signal having the turn-on level in response to a signal provided from a second sensing clock line connected to an input terminal of the second stage.

6. The display device of claim 1, wherein, in the sensing period, the second output terminal outputs the signal having the turn-on level at least three times, before the signals having the turn-on level are respectively output from the fourth output terminal and the fifth output terminal.

7. The display device of claim 6, wherein, in the sensing period, the turn-on level of the signal from the third output terminal is maintained during a period from a time at which the second output terminal starts firstly providing the turn-on level to a time at which the second output terminal finishes secondly providing the turn-on level.

8. The display device of claim 1, wherein, in the sensing period, the turn-on level of the signal from the second output terminal is maintained for six horizontal periods or more or 20 microseconds or more, before the signals having the turn-on signal are respectively output from the fourth output terminal and the fifth output terminal.

9. The display device of claim 8, wherein, in the sensing period, the first output terminal and the second output terminal respectively output the signals having the turn-on level for a same time duration.

10. The display device of claim 1, further comprising a sensor connected to each of the plurality of pixels through a receiving line, the sensor measuring degradation information of the plurality of pixels according to a received current or voltage.

11. The display device of claim 10, wherein the degradation information includes mobility information driving transistors, threshold voltage information of the driving transistors, and degradation information of light emitting devices.

12. The display device of claim 10, wherein each of the plurality of pixels includes:
    a first transistor including a first gate electrode connected to a first node, a first electrode connected to a first power line, and a second electrode connected to a second node;
    a second transistor including a second gate electrode connected to the scan line, a third electrode connected to a data line, and a fourth electrode connected to the first node;
    a third transistor including a third gate electrode connected to the sensing line, a fifth electrode connected to the receiving line, and a sixth electrode connected to the second node; and
    a light emitting device including an anode connected to the second node and a cathode connected to a second power line.

13. The display device of claim 1, wherein the pixel unit includes:
    a display substrate;
    a plurality of transistors disposed on the display substrate;
    a plurality of organic light emitting diodes disposed on the plurality of transistors;
    a wavelength conversion pattern disposed on the plurality of organic light emitting diodes, and
    a color filter disposed on the wavelength conversion pattern.

14. The display device of claim 13, wherein the wavelength conversion pattern includes a quantum dot.

15. The display device of claim 1, wherein the scan driver is disposed as an Oxide Semiconductor thin film transistor Gate ("OSG") driver circuit at one side of the pixel unit.

16. The display device of claim 1, wherein, in the sensing period, a time at which a turn-off level of the signals respectively at the fourth output terminal and the fifth output terminal is changed to the turn-on level is identical to a time at which the turn-on level of the signals respectively at the first output terminal, the second output terminal, and the third output terminal is changed to a turn-off level.

17. The display device of claim 1, wherein the first stage is disposed on an Nth row, and the second stage is disposed on an (N+2)th row.

18. The display device of claim 1, wherein each of the first stage and the second stage includes input terminals connected to a first power line, a second power line, and a third power line.

19. The display device of claim 1, wherein each of the first stage and the second stage includes a P-type transistor.

20. A scan driver driven for at least one frame including a display period and a sensing period, the scan driver comprising:
- a first stage including a first output terminal connected to a first carry line, a second output terminal connected to a first scan line, and a third output terminal connected to a first sensing line; and
- a second stage including a first input terminal connected to the first carry line, a fourth output terminal connected to a second scan line, and a fifth output terminal connected to a second sensing line,
- wherein, in the sensing period, signals having a turn-on level are respectively output from the first output terminal, the second output terminal, and the third output terminal, before a predetermined period from a time at which signals having a turn-on level are respectively output from the fourth output terminal and the fifth output terminal,
- wherein the predetermined period is equal to or less than 20 microseconds.

* * * * *